US007869273B2

(12) United States Patent
Lee et al.

(10) Patent No.: US 7,869,273 B2
(45) Date of Patent: Jan. 11, 2011

(54) REDUCING THE IMPACT OF INTERFERENCE DURING PROGRAMMING

(75) Inventors: Dana Lee, Saratoga, CA (US); Emilio Yero, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 444 days.

(21) Appl. No.: 11/849,992

(22) Filed: Sep. 4, 2007

(65) Prior Publication Data

US 2009/0059660 A1     Mar. 5, 2009

(51) Int. Cl.
*G11C 16/04* (2006.01)
(52) U.S. Cl. .................... 365/185.02; 365/185.22; 365/185.23; 365/230.04
(58) Field of Classification Search ............ 365/185.02, 365/185.22, 185.23, 230.04
See application file for complete search history.

(56) References Cited

U.S. PATENT DOCUMENTS

| | | | |
|---|---|---|---|
| 6,882,567 B1 | 4/2005 | Wong | |
| 6,888,758 B1 | 5/2005 | Hemink | |
| 6,937,520 B2 | 8/2005 | Ono | |
| 6,956,770 B2 | 10/2005 | Khalid | |
| 6,967,872 B2 * | 11/2005 | Quader et al. | 365/185.22 |
| 7,016,226 B2 * | 3/2006 | Shibata et al. | 365/185.03 |
| 7,064,980 B2 | 6/2006 | Cernea | |
| 7,073,103 B2 | 7/2006 | Gongwer | |
| 7,139,192 B1 | 11/2006 | Wong | |
| 7,221,589 B2 | 5/2007 | Li | |
| 7,260,016 B2 * | 8/2007 | Kouno | 365/230.04 |
| 2005/0207259 A1 | 9/2005 | Kouno | |
| 2006/0004952 A1 | 1/2006 | Lasse | |
| 2006/0193176 A1 * | 8/2006 | Li | 365/185.17 |
| 2006/0245269 A1 | 11/2006 | Martines | |
| 2006/0250850 A1 | 11/2006 | Lee | |

OTHER PUBLICATIONS

International Search Report dated Dec. 16, 2008, PCT Appl. No. PCT/US2008/074621, filed Aug. 28, 2008.
Written Opinion of the International Searching Authority dated Dec. 16, 2008, PCT Appl. No. PCT/US2008/074621, filed Aug. 28, 2008.
International Preliminary Report on Patentability dated Mar. 9, 2010, PCT Appl. No. PCT/US2008/074621, filed Aug. 28, 2008.

(Continued)

*Primary Examiner*—Connie C Yoha
(74) *Attorney, Agent, or Firm*—Vierra Magen Marcus & DeNiro LLP

(57) ABSTRACT

A system for programming non-volatile storage is proposed that reduces the impact of interference from the boosting of neighbors. Memory cells are divided into two or more groups. In one example, the memory cells are divided into odd and even memory cells; however, other groupings can also be used. Prior to a first trigger, a first group of memory cells are programmed together with a second group of memory cells. Subsequent to the first trigger and prior to a second trigger, the first group of memory cells are programmed separately from the second group of memory cells. Subsequent to the second trigger, the first group of memory cells are programmed together with the second group of memory cells. Before and after both triggers, the first group of memory cells are verified together with the second group of memory cells.

49 Claims, 18 Drawing Sheets

OTHER PUBLICATIONS

Written Opinion of the International Searching Authority dated Dec. 15, 2008, PCT Appl. No. PCT/US2008/074621, filed Aug. 28, 2008.

Fong, et al., U.S. Appl. No. 11/766,583, filed Jun. 21, 2007.

Fong, et al., U.S. Appl. No. 11/766,580, filed Jun. 21, 2007.

Supplementary European Search Report, dated Aug. 12, 2001, European Patent Appl. No. EP 08829629.

* cited by examiner

Fig 6
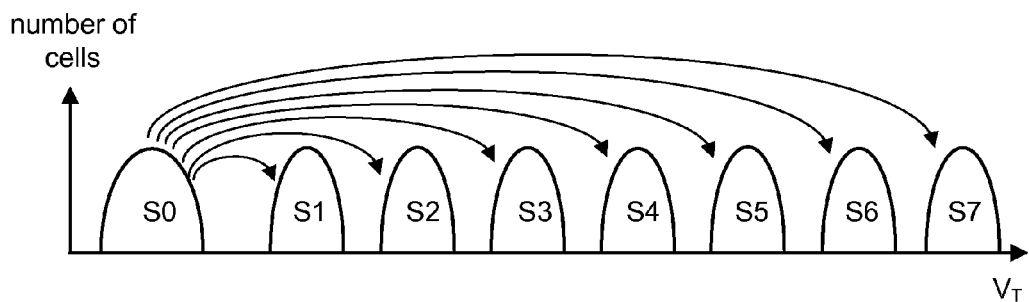
Fig. 9
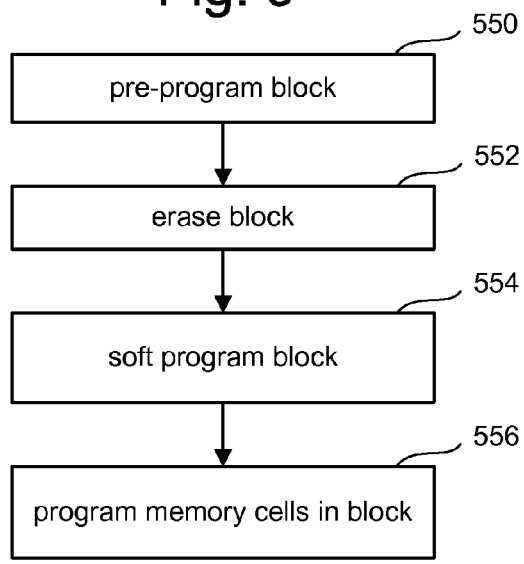
Fig 8
|  | First Page | Second Page | Third Page |
|---|---|---|---|
| WL0 | 1 | 3 | 6 |
| WL1 | 2 | 5 | 9 |
| WL2 | 4 | 8 | 11 |
| WL3 | 7 | 10 | 12 |

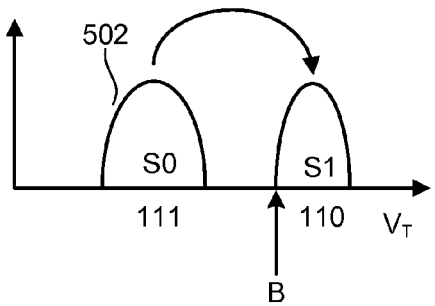
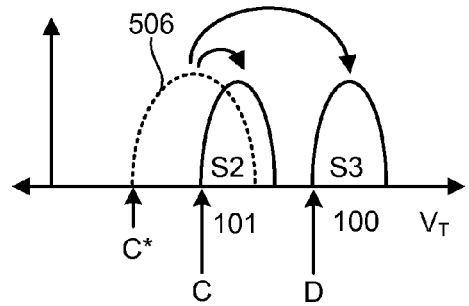
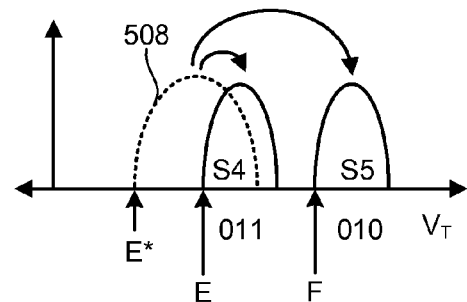
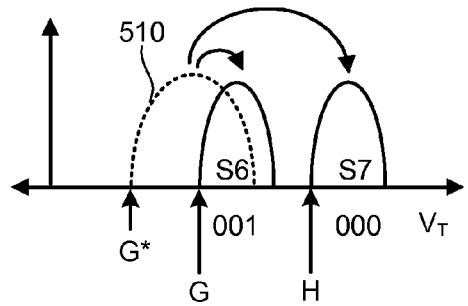
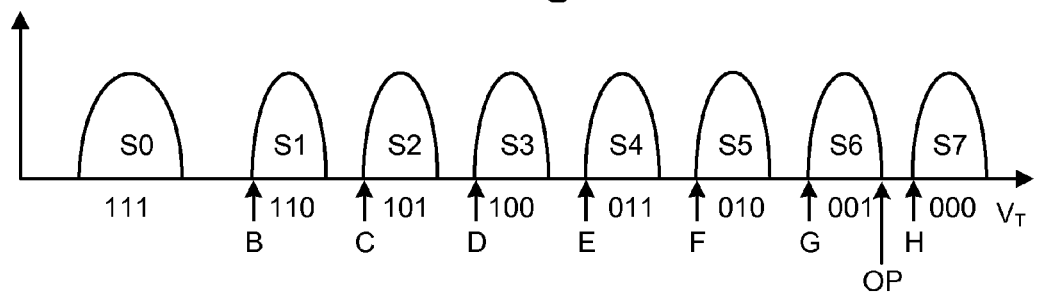

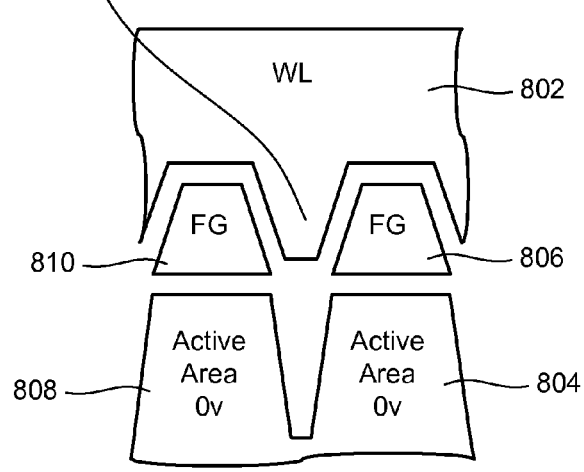
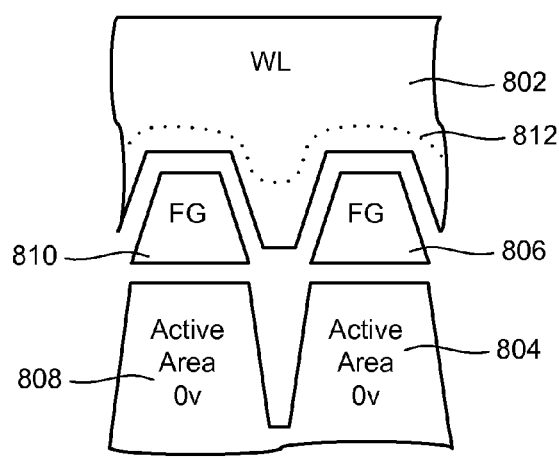 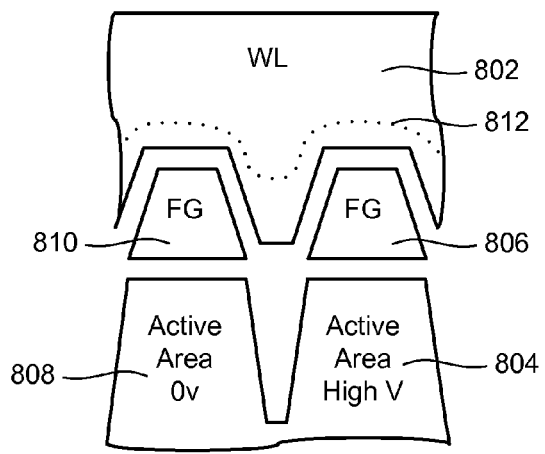

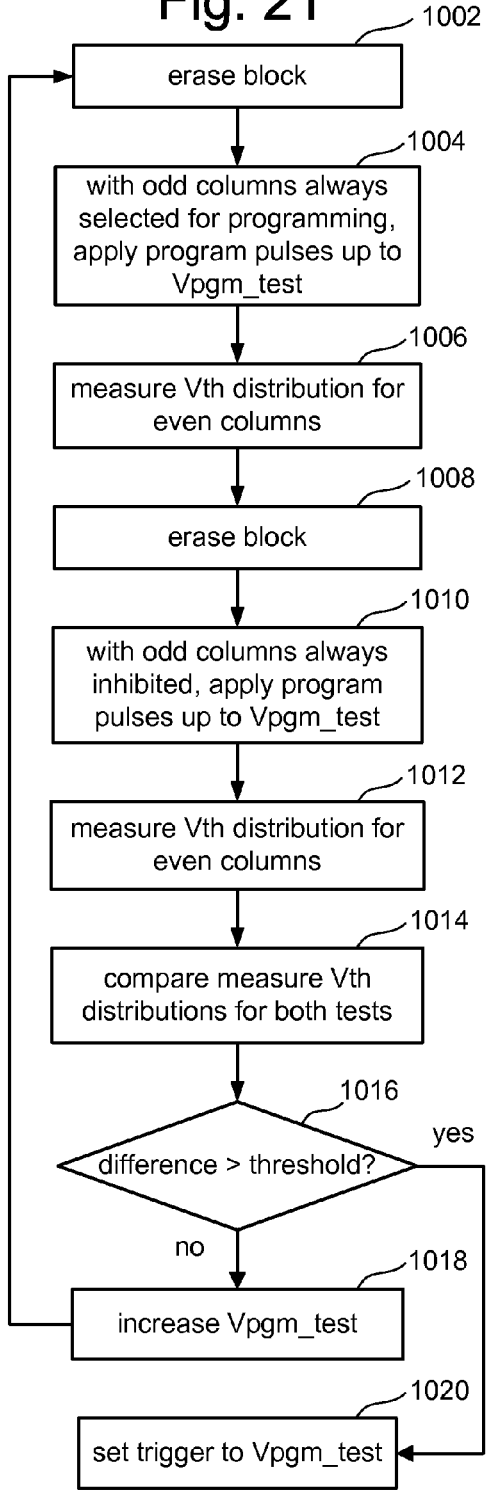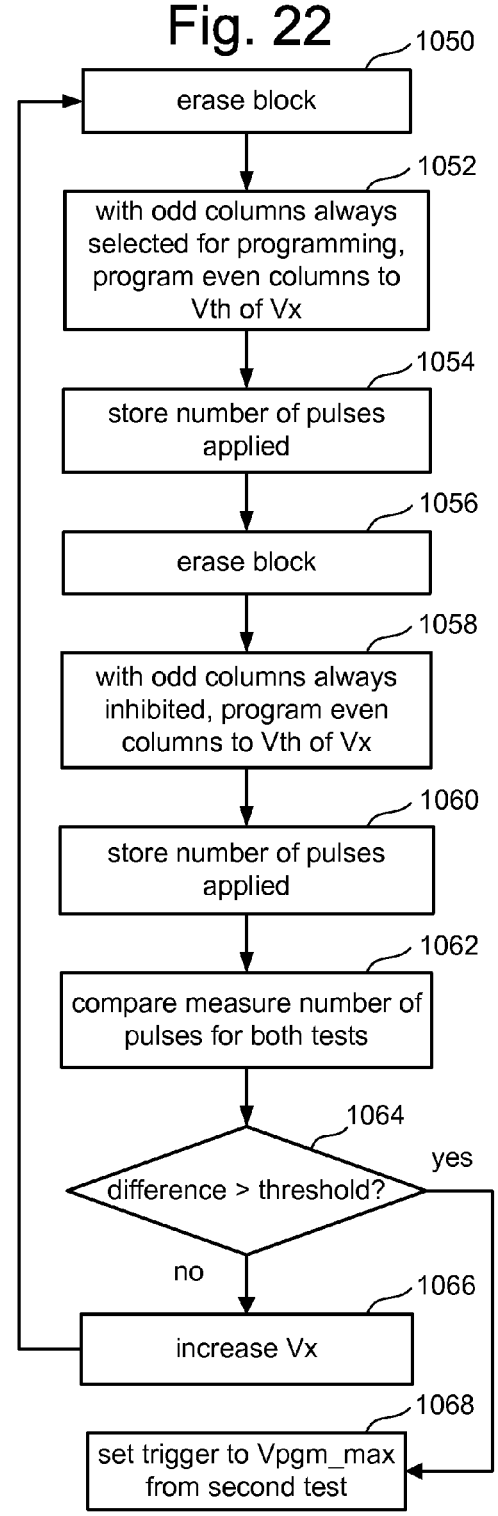

REDUCING THE IMPACT OF INTERFERENCE DURING PROGRAMMING

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate. Thus, a memory cell (which can include one or more transistors) can be programmed and/or erased by changing the level of charge on a floating gate in order to change the threshold voltage.

Each memory cell can store data (analog or digital). When storing one bit of digital data (referred to as a binary memory cell), possible threshold voltages of the memory cell are divided into two ranges which are assigned logical data "1" and "0." In one example of a NAND type flash memory, the threshold voltage is negative after the memory cell is erased, and defined as logic "1." After programming, the threshold voltage is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11." Positive threshold voltages are used for the states of "10", "01", and "00." If eight levels of information (or states) are stored in each memory cell (e.g. for three bits of data), there will be eight threshold voltage ranges assigned to the data values "000", "001", "010", "011" "100", "101", "110" and "111." The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells. Different encoding schemes can be used.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," both of which are incorporated herein by reference in their entirety. In many devices, the program voltage applied to the control gate during a program operation is applied as a series of pulses in which the magnitude of the pulses is increased by a predetermined step size for each successive pulse.

Many non-volatile storage systems include an array of memory cells arranged in columns and rows. Control lines (e.g., word lines, bit lines, or other types of control lines) connect to the various rows and columns. In one example, word lines are used to access rows of memory cells while bit lines are used to access columns of memory cell. In this arrangement, the series of pulses of the program voltage are applied to a selected word line that is connected to a set of selected memory cells. Each of the selected memory cells receiving the pulses potentially has its threshold voltage raised in response thereto. As the memory cells reach their target threshold voltage, they are locked out from further programming. It has been observed that as memory cells become locked out, they interfere with the expected programming rate of their neighbor memory cells. This effect can cause the neighbor memory cells to overshoot their intended target threshold voltage and, therefore, become over-programmed. In some cases, an over-programmed memory cell will cause an error when being read.

SUMMARY

Technology is described herein that reduces the impact of interference between neighboring memory cells during programming.

One embodiment includes performing programming on a first group of non-volatile storage elements at a first time, performing programming on a second group of non-volatile storage elements at a second time different from the first time, and verifying the first group of non-volatile storage elements and the second group of non-volatile storage elements together.

One embodiment includes applying multiple programming pulses to a set of non-volatile storage elements including programming a first subset of the non-volatile storage elements with a first programming pulse without intentionally programming a second subset of the non-volatile storage elements and programming the second subset of the non-volatile storage elements with a second programming pulse without intentionally programming the first subset of the non-volatile storage elements. The process further comprises performing a verification process for the set of non-volatile storage elements subsequent to applying the first programming pulse and the second programming pulse. The verification process includes verifying whether the first subset of non-volatile storage elements have reached one or more targets in response to the first programming pulse and verifying whether the second subset of non-volatile storage elements have reached one or more targets in response to the second programming pulse.

One embodiment includes, before a first trigger, programming together and verifying together a first group of non-volatile storage elements and a second group of non-volatile storage elements. After the first trigger, the first group of non-volatile storage elements is programmed separately from the second group of non-volatile storage elements and the first group of non-volatile storage elements is verified together with the second group of non-volatile storage elements.

One embodiment includes, before detecting a first condition, performing a set of one or more programming cycles that each include using a first pulse to program a first subset of non-volatile storage elements and separately using a second pulse to program a second subset of non-volatile storage elements. The one or more programming cycles include verifying the first subset of non-volatile storage elements and the second subset of non-volatile storage elements together. After detecting the first condition, a group of one or more program cycles are performed that each include using one pulse to program the first subset of non-volatile storage elements and the second subset of the group of non-volatile storage elements together. The group of one or more program cycles includes verifying the first subset of non-volatile storage elements and the second subset of non-volatile storage elements together.

One embodiment comprises a plurality of non-volatile storage elements (including a first group of non-volatile storage elements and a second group of non-volatile storage elements) and one or more managing circuits in communication with the non-volatile storage elements. The one or more managing circuits program the first group of non-volatile storage elements separately from programming the second group of non-volatile storage elements. The one or more managing circuits verify the first group of non-volatile storage elements together with verifying the second group of non-volatile storage elements.

One embodiment comprises a plurality of non-volatile storage elements (including a first group of non-volatile storage elements and a second group of non-volatile storage elements) and one or more managing circuits in communication with the non-volatile storage elements. Before a trigger, the one or more managing circuits perform a first set of one or more program cycles and after the trigger the one or more managing circuits perform a second set of one or more program cycles. The first set of one or more program cycles each use one pulse to program the group of non-volatile storage elements together. The first set of one or more program cycles each verify the group of non-volatile storage elements together. The second set of one or more program cycles each use a first pulse to program the first subset of non-volatile storage elements and separately use a second pulse to program the second subset of non-volatile storage elements. The second set of one or more program cycles each verify the group of non-volatile storage elements together.

One embodiment comprises a first group of non-volatile storage elements, a second group of non-volatile storage elements, and one or more managing circuits in communication with the first group of non-volatile storage elements and the second group of non-volatile storage elements. Before a condition, the one or more managing circuits program the first group of non-volatile storage elements separately from the second group of non-volatile storage elements and verify the first group of non-volatile storage elements together with the second group of non-volatile storage elements. After the condition the one or more managing circuits program and verify the first group of non-volatile storage elements and the second group of non-volatile storage elements together.

BRIEF DESCRIPTION OF THE DRAWINGS

FIG. 6 depicts an example set of threshold voltage distributions and describes a process for programming non-volatile memory.
FIGS. 7A-I show various threshold voltage distributions and describe a process for programming non-volatile memory.
FIG. 8 is a table depicting one example of an order of programming non-volatile memory.
FIG. 9 depicts a flow chart describing one embodiment of a process for programming non-volatile memory.
FIGS. 11A-C depict portions of two example neighboring memory cells.
FIG. 21 is a flow chart describing one embodiment of a process for determining a trigger point to change the programming process.
FIG. 22 is a flow chart describing one embodiment of a process for determining a trigger point to change the programming process.

DETAILED DESCRIPTION

Figure 1:
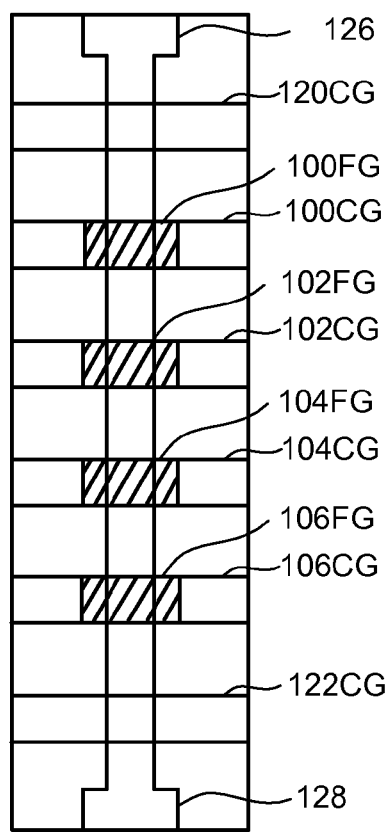
FIG. 1 is a top view of a NAND string.
Figure 2:
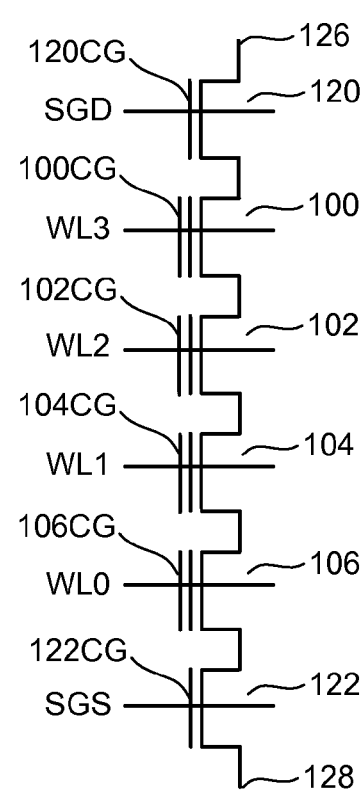
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Relevant examples of NAND type flash memories and their operation are provided in the following U.S. patents/patent applications, all of which are incorporated herein by reference: U.S. Pat. Nos. 5,570,315; 5,774,397; 6,046,935; 6,456,528; and U.S. Pat. Publication No. US2003/0002348. The discussion herein can also apply to other types of flash memory in addition to NAND, as well as other types of non-volatile memory.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric. Other types of non-volatile storage can also be used.

Figure 3:
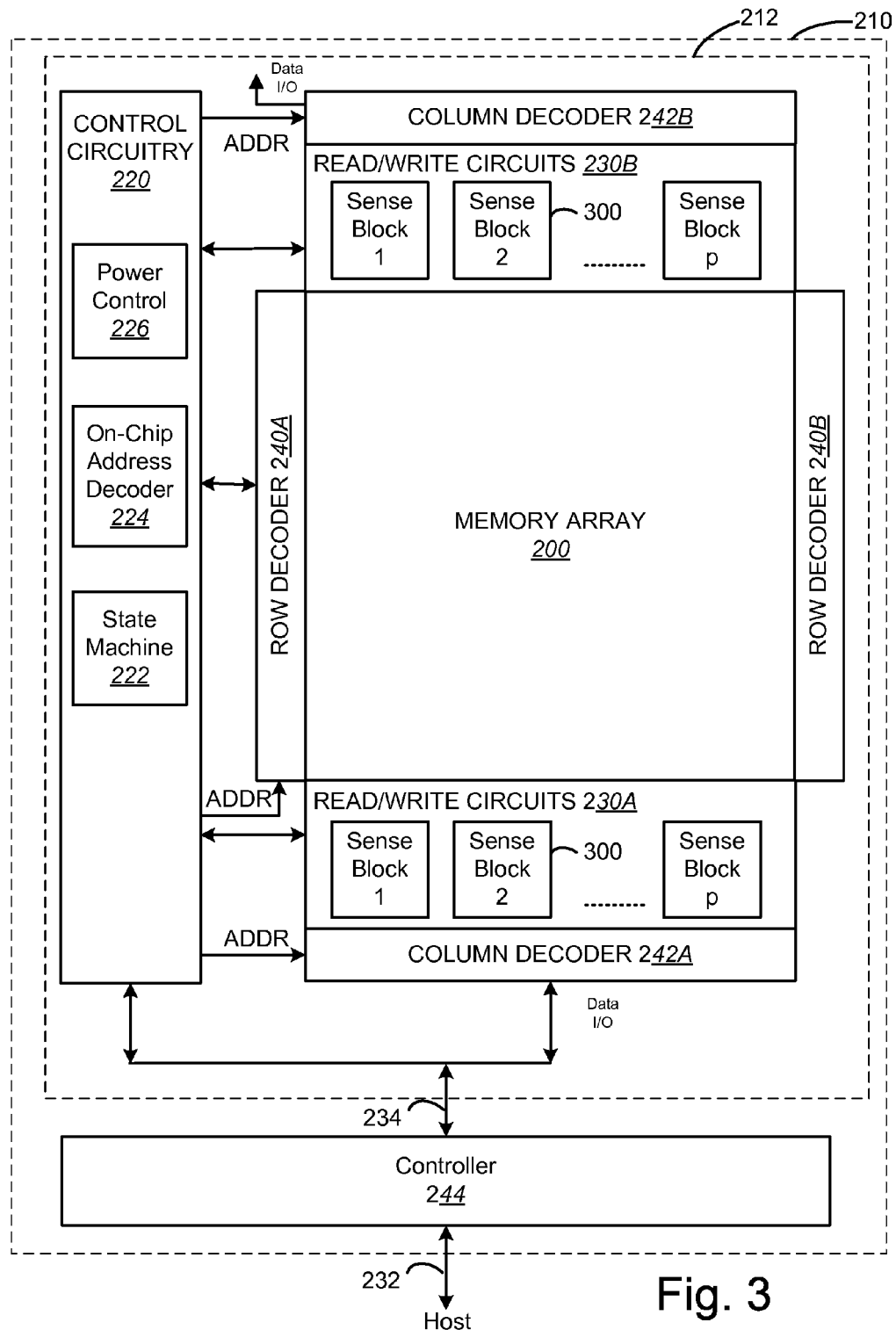
FIG. 3 is a block diagram of a non-volatile memory system.

FIG. 3 illustrates a memory device 210 having read/write circuits for reading and programming a page (or other unit) of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 4:
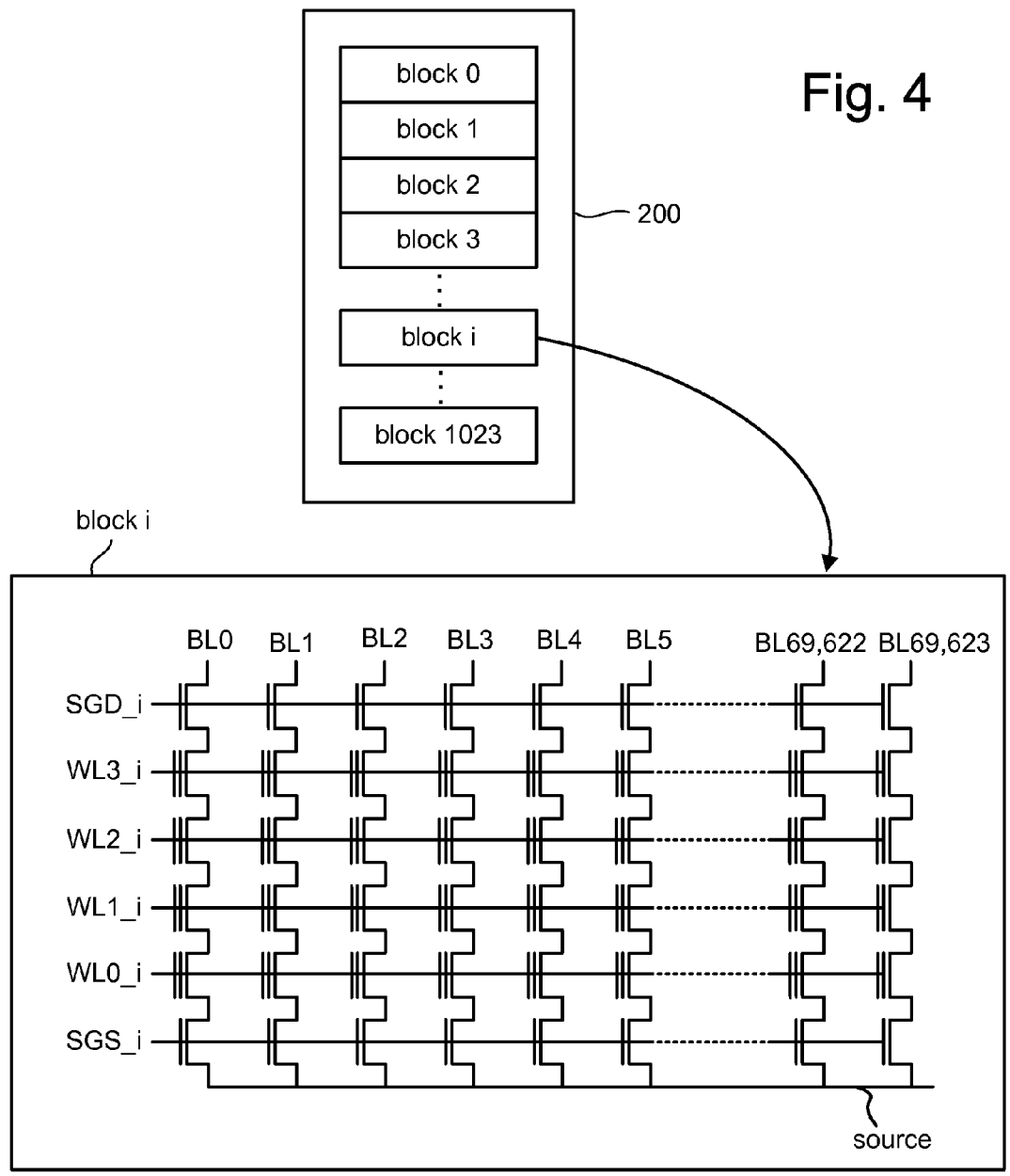
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of eras can also be used.

A block contains a set of NAND stings which are accessed via bit lines (e.g., bit lines BL0-BL69623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Figure 5:
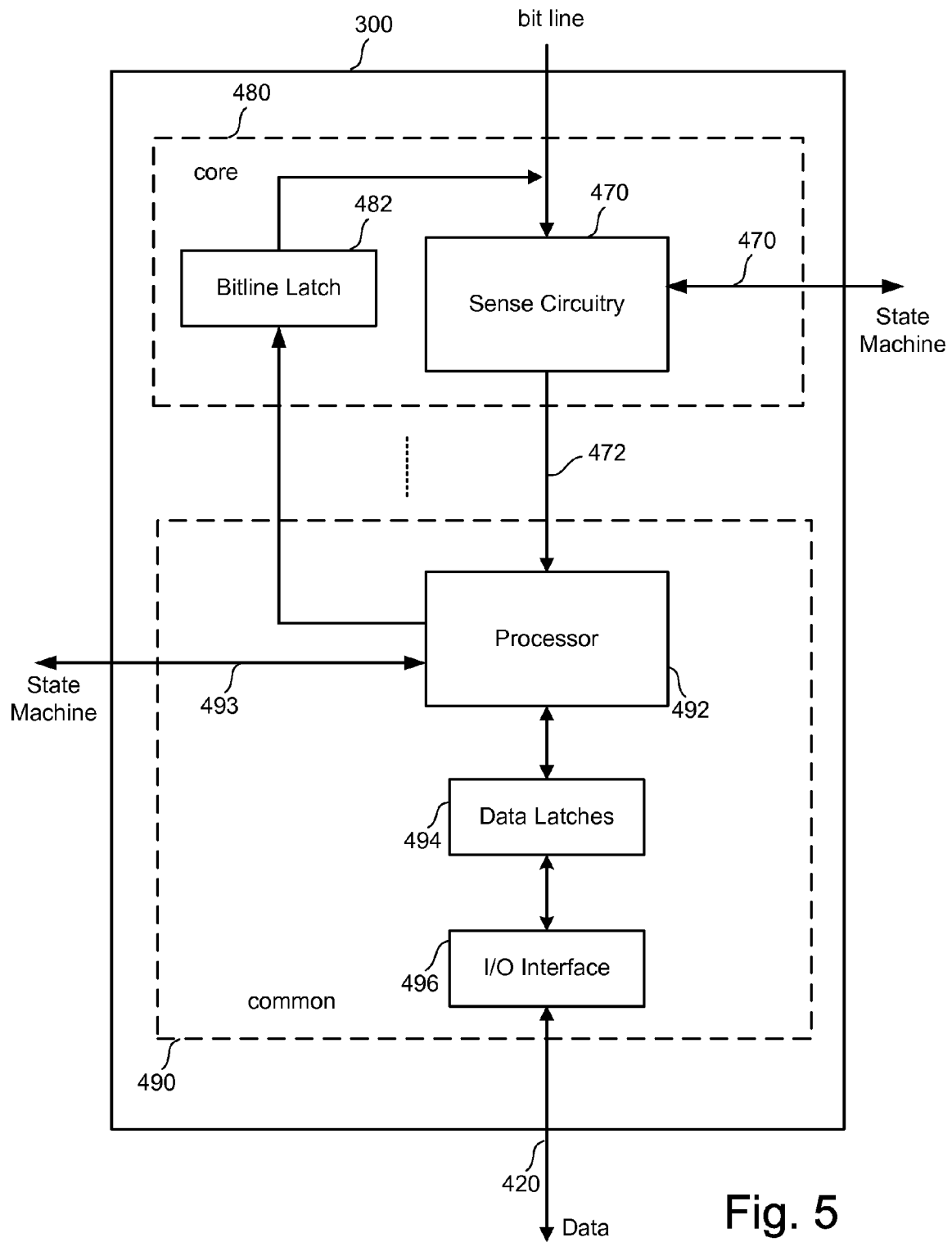
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions (or data states) for the memory cell array when each memory cell stores three bits of data. Other embodiment, however, may use more or less than three bits of data per memory cell (e.g., such as four or more bits of data per memory cell).

In the example of FIG. 6, each memory cell stores three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state corresponds to a unique value for the three bits stored in the memory cell. In one embodiment, S0=111, S1=110, S2=101, S3=100, S4=011, S5=010, S6=001 and S7=000. Other mapping of data to states S0-S7 can also be used. In one embodiment, all of the bits of data stored in a memory cell are stored in the same logical page. In other embodiments, each bit of data stored in a memory cell correspond to different pages. Thus, a memory cell storing three bits of data would include data in a first page, a second page and a third page. In some embodiments, all of the memory cells connected to the same word line would store data in the same three pages of data. In some embodiments, the memory cells connected to a word line can be grouped in to different sets of pages (e.g., by odd and even bit lines, or by other arrangements).

In some prior art devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 6.

FIGS. 7A-7I disclose another process for programming non-volatile memory that reduces the effect of floating gate to floating gate coupling by, for any particular memory cell, writing to that particular memory cell with respect to a particular page subsequent to writing to adjacent memory cells for previous pages. The process of FIGS. 7A-7I is a three step programming process. Prior to the first step, the memory cells will be erased so that they are in the erase threshold distribution of state S0.

The process of FIGS. 7A-7I assumes that each memory cell stores three bits of data, with each bit being in a different page. The first bit of data (the leftmost bit) is associated with the first page. The middle bit is associated with the second page. The rightmost bit is associated with the third page. The correlation of data states to data is as follows: S0=111, S1=110, S2=101, S3=100, S4=011, S5=010, S6=001 and S7=000. However, other embodiments can use other data encoding schemes.

Figure 7A:
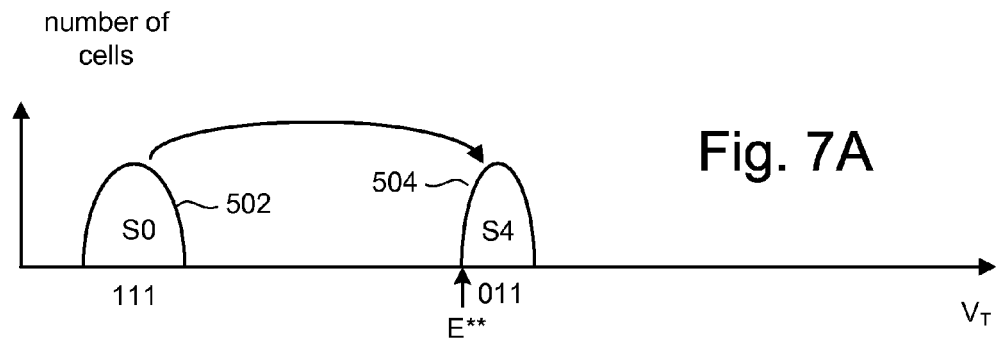
Figure 7B:
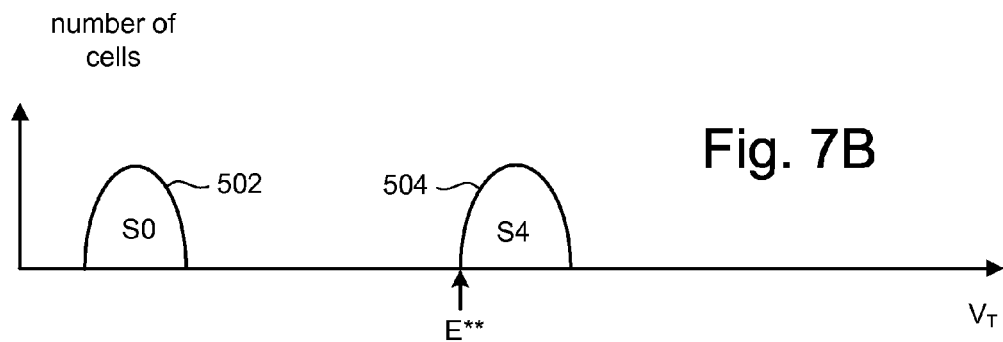

When programming the first page (as described in FIG. 7A), if the bit is to be data "1" then the memory cell will stay in state S0 (threshold voltage distribution 502). If the bit is to be data "0" then the memory cell is programmed to state S4 (threshold voltage distribution 504). After adjacent memory cells are programmed, capacitive coupling between adjacent floating gates may cause the state S4 to widen as depicted in FIG. 7B. State S0 may also widen, but there is sufficient margin between S0 and S1 to ignore the effect. More information about capacitive coupling between adjacent floating gates can be found in U.S. Pat. Nos. 5,867,429 and 6,657,891, both of which are incorporated herein by reference in their entirety.

Figure 7C:
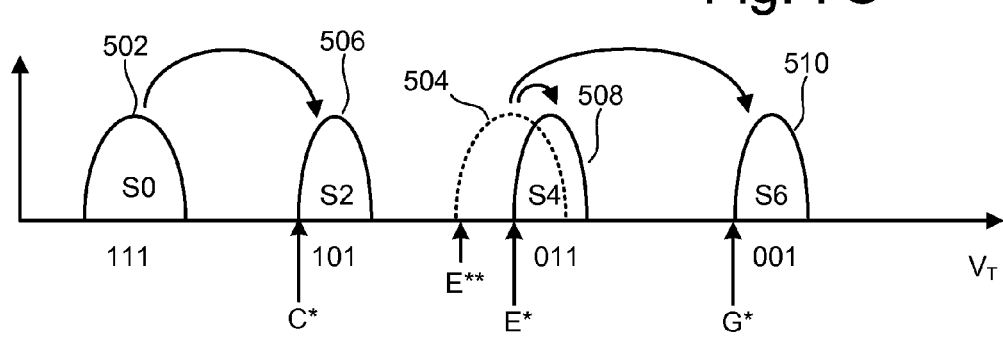

When programming the second page (see FIG. 7C), if the memory cell is in state S0 and the second page bit is data "1" then the memory cell stays in state S0. In some embodiments, the programming process for the second page will tighten threshold voltage distribution 501 to a new S0. If the memory cell was in state S0 and the data to be written to the second page is "0", then the memory cell is moved to state S2 (threshold voltage distribution 506). State S2 has a verify point (lowest voltage) of C*. If the memory cell was in state S4 and the data to be written to the memory cell is "1" then the memory cell remains in S4. However, state S4 is tightened by moving the memory cells from threshold voltage distribution 504 to threshold voltage distribution 508 for state S4, as depicted in FIG. 7C. Threshold voltage distribution 508 has a verify point of E* (as compared to E** of threshold voltage distribution 504). If the memory cell is in state S4 and the data to be written to the second page is a "0" then the memory cell has its threshold voltage moved to state S6 (threshold voltage distribution 510), with a verify point of G*.

Figure 7D:
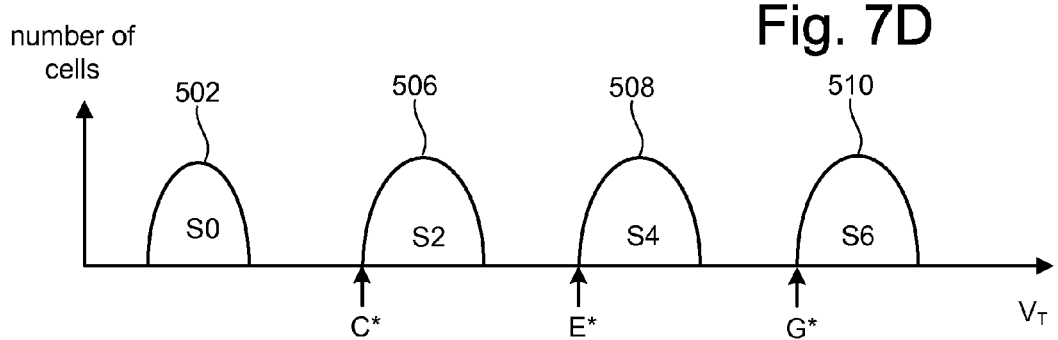

After the adjacent memory cells are programmed, the states S2, S4 and S6 are widened due to the floating gate to floating gate coupling, as depicted by threshold voltages distributions 506, 508 and 510 of FIG. 7D. In some cases, state S0 may also widen.

FIGS. 7E, 7F, 7G and 7H depict the programming of the third page. While one graph can be used to show the programming, the process is depicted in four graphs for visibility reasons. After the second page has been programmed, the memory cells are either in states S0, S2, S4 or S6. FIG. 7E shows the memory cell that is in state S0 being programmed for the third page. FIG. 7F shows the memory cell that is state S2 being programmed for the third page. FIG. 7G shows the memory cell that is in state S4 being programmed for the third page. FIG. 7H shows the memory cell that is in state S6 being programmed for the third page. FIG. 7I shows the threshold voltage distributions after the processes of FIGS. 7E, 7F, 7G and 7H have been performed on the population of memory cells (concurrently or serially).

If the memory cell is in state S0 and the third page data is "1" then the memory cell remains at state S0. If the data for the third page is "0" then the threshold voltage for the memory cell is raised to be in state S1, with a verify point of B (see FIG. 7E).

If the memory cells in state S2 and the data to be written in the third page is "1", then the memory cell will remain in state S2 (see FIG. 7F). However, some programming will be performed to tighten the threshold distribution 506 to a new state S2 with a verify point of C volts. If the data to be written to the third page is "0," then the memory cell will be programmed to state S3, with a verify point of D volts.

If the memory cell is in state S4 and the data to be written to the third page is "1" then the memory cell will remain in state S4 (see FIG. 7G). However, some programming will be performed so that threshold voltage distribution 508 will be tightened to new state S4 with a verify point of E. If the memory cell is in state S4 and the data to be written to the third page is "0" then the memory cell will have its threshold voltage raised to be in state S5, with a verify point of F.

If the memory cell is in state S6 and the data to be written to the third page is "1" then the memory cell will remain in state S6 (see FIG. 7H). However, there will be some programming so that the threshold voltage distribution 510 is tightened to be in new state S6, with a verify point at G. If the third page data is "0" then the memory cell will have its threshold voltage programmed to state S7, with a verify point at H. At the conclusion of the programming of the third page, the memory cell will be in one of the eight states depicted in FIG. 7I.

FIG. 8 depicts one example of an order for programming the pages of a set or memory cells. The table provides the order for programming with respect to the four word lines (WL0, WL1, WL2 and WL3) of FIG. 4; however, the table can be adapted to accommodate more or less than four word lines. The first page of the memory cells connected to WL0 are programmed, followed by the programming of the first page of the memory cells connected to WL1, followed by the programming of the second page of the memory cells connected to WL0, followed by the programming of the first page of the memory cells connected to WL2, followed by the programming of the second page of the memory cells connected to WL1, etc.

FIG. 9 is a flow chart describing a programming process for programming memory cells connected to a selected word line. In one embodiment, the process of FIG. 9 is used to program a block of memory cells. In one implementation of the process of FIG. 9, memory cells are pre-programmed in order to maintain even wear on the memory cells (step 550). In one embodiment, the memory cells are preprogrammed to state 7, a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells. In one embodiment, after erasing the memory cells, all of the erased memory cells will be in state S0 (see FIG. 6).

At step 554, soft programming is performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells closer to the erase verify level. For example, looking at FIG. 6, step 554 can include tightening the threshold voltage distribution associated with state S0. In step 556, the memory cells of the block are programmed as described herein. The process of FIG. 9 can be performed at the direction of the state machine using the various circuits described above. In other embodiments, the process of FIG. 9 can be performed at the direction of the controller using the various circuits described above. After performing the process of FIG. 9, the memory cells of the block can be read.

Figure 10:
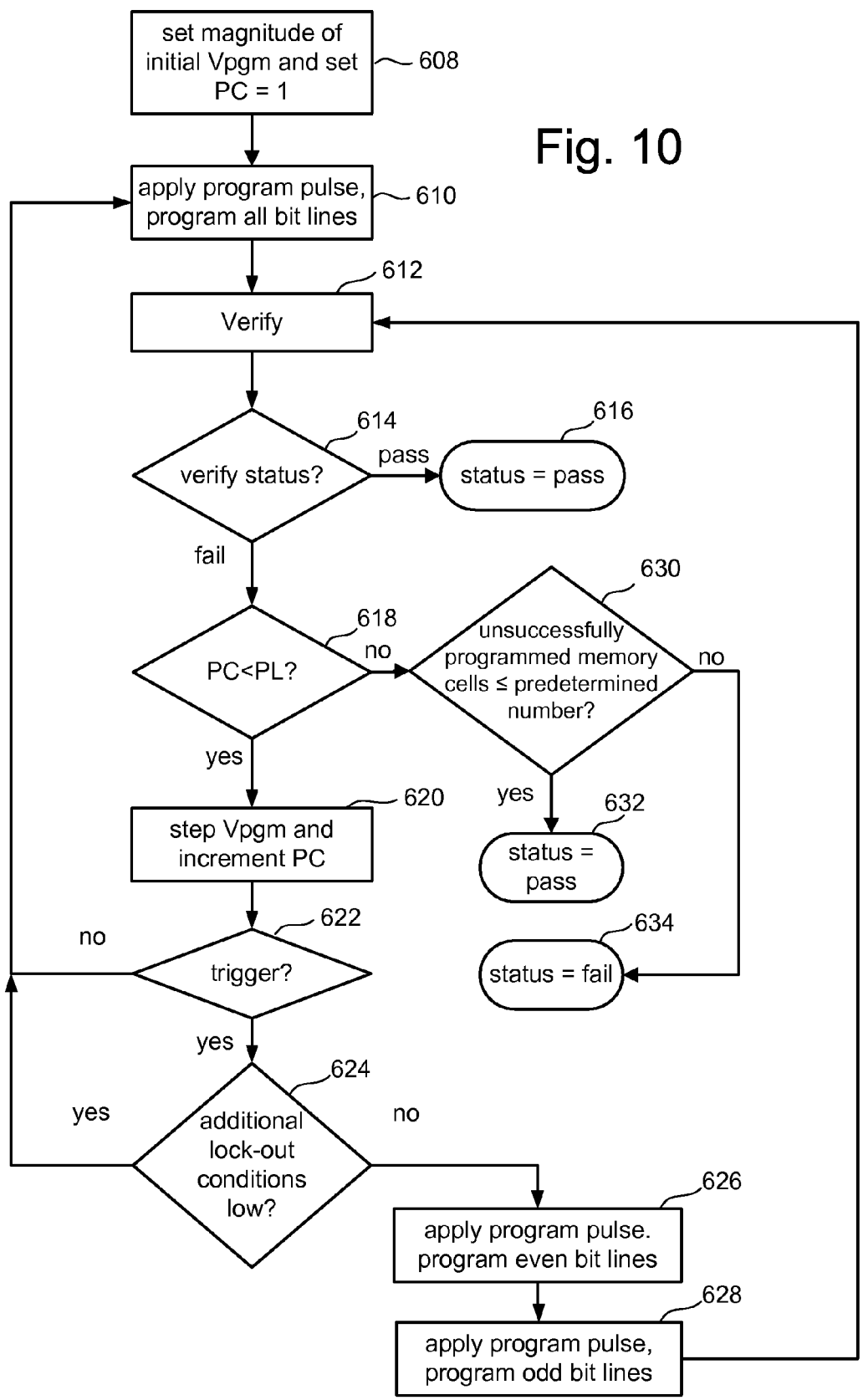
FIG. 10 depicts a flow chart describing one embodiment of a process for programming non-volatile memory elements.

FIG. 10 is a flow chart describing one embodiment of a process for performing programming on memory cells connected to a common word line. The process of FIG. 10 can be performed one or multiple times during step 556 of FIG. 9. For example, the process of FIG. 10 can be used to perform the full sequence programming of FIG. 6, in which case the process of FIG. 10 would be performed once for each word line. In one embodiment, the programming process is performed in an order that starts from the word line closest to the source line, working toward the bit line. The process of FIG. 10 can also be used to perform the programming of a page of data for a word line, with respect to the programming process of FIGS. 7A-I, in which case the process of FIG. 10 would be performed three times for each word line. Other arrangements can also be used. The process of FIG. 10 is performed at the direction of the state machine 222.

Typically, the program voltage applied to the control gate during a program operation is applied as a series of program pulses. In between programming pulses are a set of verify pulses to enable verification. In many implementations, the magnitude of the program pulses is increased with each successive pulse by a predetermined step size. In step 608 of FIG. 10, the programming voltage (Vpgm) is initialized to the starting magnitude (e.g., ~12-16V or another suitable level) and a program counter PC maintained by state machine 222 is initialized at 1. In step 610, a program pulse of the program signal Vpgm is applied to the selected word line (the word line selected for programming). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to $V_{DD}$ to inhibit programming. More information about boosting schemes can be found in U.S. Pat. No. 6,859,397 and U.S. patent application Ser. No. 11/555,850, both of which are incorporated herein by reference.

In step 610, the program pulse is concurrently applied to all memory cells connected to the selected word line so that all of the memory cells connected to the selected word line are programmed together. That is, they are programmed at the same time (or during overlapping times). In this manner all of the memory cells connected to the selected word line will concurrently have their threshold voltage change, unless they have been locked out from programming.

In step 612, the states of the selected memory cells are verified using the appropriate set of target levels. Step 612 of FIG. 10 includes performing one or more verify operations. In general, during verify operations and read operations, the selected word line is connected to a voltage, a level of which is specified for each read and verify operation (e.g. see B, C, D, E, F, G and H of FIG. 7I) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287, "Non-Volatile Memory And Method With Reduced Source Line Bias Errors," published on Mar. 25, 2004; (2) United States Patent Application Pub. No. 2004/0109357, "Non-Volatile Memory And Method with Improved Sensing," published on Jun. 10, 2004; (3) U.S. Patent Application Pub. No. 20050169082; and (4) U.S. Patent Publication 2006/0221692, titled "Compensating for Coupling During Read Operations of Non-Volatile Memory," Inventor Jian Chen, filed on Apr. 5, 2005.

If it is detected that the threshold voltage of a selected memory cell has reached the appropriate target level, then the memory cell is locked out of further programming by, for example, raising its bit line voltage to Vdd during subsequent programming pulses. Additionally, a pass voltage (e.g. ~10 volts) is applied to the unselected word lines during a programming operation (e.g., step 610). The unselected word lines (at the pass voltage) couple to the unselected bit lines (at Vdd), causing a voltage (e.g. approximately eight volts) to exist in the channel of the unselected bit lines, which prevents programming. Other schemes for locking out memory cells from programming can also be used with the technology described herein.

Looking back at FIG. 10, in step 614 it is checked whether all of memory cells have reached their target threshold voltages. If so, the programming process is complete and successful because all selected memory cells were programmed and verified to their target states. A status of "PASS" is reported in step 616. Note that in some implementations, in step 614 it is checked whether at least a predetermined number of memory cells have been properly programmed. This predetermined number can be less than the number of all memory cells, thereby allowing the programming process to stop before all memory cells have reached their appropriate verify levels. The memory cells that are not successfully programmed can be corrected using error correction during the read process.

If, in step 614, it is determined that not all of the memory cells have reached their target threshold voltages, then the programming process continues. In step 618, the program counter PC is checked against a program limit value (PL). One example of a program limit value is 20; however, other values can be used. If the program counter PC is not less than the program limit value, then it is determined in step 630 whether the number of memory cells that have not been successfully programmed is equal to or less than a predetermined number. If the number of unsuccessfully programmed memory cells is equal to or less than the predetermined number, then the programming process is flagged as passed and a status of PASS is reported in step 632. In many cases, the memory cells that are not successfully programmed can be corrected using error correction during the read process. If, however, the number of unsuccessfully programmed memory cells is greater than the predetermined number, the program process is flagged as failed and a status of FAIL is reported in step 634.

If, in step 618, it is determined that the Program Counter PC is less than the Program Limit value PL, then the process continues at step 620 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). In step 622, it is determined whether a trigger has occurred. In one embodiment, a trigger has occurred when the magnitude of the program voltage Vpgm (e.g., a program pulse) reaches a trigger voltage. Other embodiments could use other triggers (e.g., based on time, number of bits programmed, number of pulses, current, etc.). If the trigger has not occurred, the process loops back to step 610 and the next program pulse (at the new magnitude set in step 620) is applied to the selected word line so that programming on all bit lines (except those memory cells locked-out because they reached their target state) occurs. The process continues from step 610 as described above.

The trigger is set so that it signals or otherwise indicates a lock-out condition that involves capacitive coupling. In general, there is capacitive coupling between neighboring floating gates. When both neighboring floating gates (first floating gate and second floating gate) are being programmed, the capacitive coupling remains constant and/or predictable. When the first floating gate locks-out from programming because it reaches its target state, the voltage potential of that first floating gate will increase because of boosting. Because the first floating gate has the higher voltage potential, capacitive coupling to the second floating gate increases. The higher capacitive coupling will increase the voltage on the second floating gate, which will increase the speed of programming of the second floating gate. This can cause over-programming. The risk over over-programming is greater at the transition from the slower programming (when both neighbor memory cells are still being programmed) to the faster programming (when a memory cell is being programmed and its neighbor memory cell is inhibited from programming).

FIG. 11A shows two neighboring floating gates 806 and 810. Each floating gate 806 and 810 is positioned above respective active areas 804 and 808. A common word line polysilicon layer 802 acts as control gates for both floating gates and also provides a shield 805 between the floating gates. Shield 805 reduces coupling between floating gates 806 and 810. FIG. 11A shows both floating gates being programmed; therefore, their active areas are set at zero volts. As described above, if one of the floating gates is locked-out from programming, its active area will be boosted up to between 7 and 10 volts, thereby boosting the voltage potential of the respective floating gate and causing increased capacitive coupling to its neighbor floating gate. The neighbor floating gate will then program faster. Faster programming could cause over-programming.

Although shield 805 between the floating gates 806 and 810 helps to reduce the capacitive coupling, when a large voltage is applied to the word line the polysilicon shield 805 becomes depleted. For example, FIG. 11B shows the same two floating gates 806 and 810 with a dotted line 812 in the word line polysilicon layer 802. The area below dotted line 812 is depleted. Because the area below dotted line 812 is depleted, it does not provide full shielding to the capacitive coupling described above.

FIG. 11C shows the same two floating gates 806 and 810 with the depleted region below dotted line 812. However, FIG. 11C shows floating gate 806 being locked-out from programming. Therefore, active area 804 is at a high voltage which causes floating gate 806 to be at a high voltage.

Because floating gate 806 is at a higher voltage and shield 805 is depleted, the capacitive coupling between floating gates 806 and 810 will cause floating gate 810 to have a higher potential and, therefore, program faster.

In one embodiment device characterization (including simulation) is used to determine at what word line voltage the polysilicon word line layer 802 becomes depleted so that coupling occurs, as described with respect to FIG. 11C. In other embodiments, this word line voltage can be measured by testing actual silicon. In some embodiments, every piece of silicon can be tested. In other embodiments, a sample of parts can be tested and the measured voltage can be used on an entire group of parts. Other means for determining the voltage that starts depletion can also be used.

That word line voltage in which the depletion is severe enough to cause increase in programming speed as described above is the trigger voltage used in step 622 of FIG. 10. Thus, if the magnitude of the Vpgm program pulse has reached the trigger voltage for which there is sufficient depletion in the word line polysilicon layer to allow coupling, then the trigger is met and the process proceeds to step 624 of FIG. 10. The condition at which the word line polysilicon layer is depleted and allows coupling when one neighbor is locked-out and the other neighbor is still programming, thereby potentially speeding up the programming, is referred to herein as the lock-out condition.

If the trigger has been met in step 622, it is determined whether the chance of additional lock-out conditions is low in step 624. As discussed above, a lock-out condition occurs when one memory cell is being programmed, a neighbor memory cell is locked-out from programming, and the word line voltage is high enough. A lockout condition causes faster programming. Over-programming can occur when there is a transition from slower programming to faster programming. Thus, in one embodiment, the system checks to see if there are potential transitions from slow to fast programming that can occur due to onset of the lockout condition. The system checks for potential transitions from slow to fast programming by checking the potential number of new/additional lock-out conditions. In some embodiments, the system can tolerate a small number of errors because these errors can be corrected during the read process using error correction schemes known in the art. Therefore, if the number of potential lock-out conditions is small enough, the system can tolerate the potential for error and not have to correct for it during programming. In those cases where the chance of new the lock-out condition is low for the current programming process depicted in FIG. 10, then the process continues from step 624 back to step 610, and the next program pulse is applied in order to program memory cells on all bit lines that have not been locked-out from programming. If, in step 624, it is determined that the potential number of new/additional lock-out conditions is not low, then the process proceeds to perform steps 626 and 628 which includes programming memory cells on even bit lines separately and at a different time than programming memory cells on odd bit lines.

Looking back at FIG. 4, a block of memory cells is depicted (block i). In one embodiment, the memory cells along a word line are broken up into two groups. The first group are all those memory cells connected to odd bit lines (e.g., BL1, BL3, BL5, . . . ). The second group includes all memory cells connected to even bit lines (e.g., BL0, BL2, BL4, . . . ). As can be seen from FIG. 4, the even bit lines and odd bit lines are interleaved. Thus, the group of memory cells connected to the even bit lines are interleaved with the memory cells connected to the odd bit lines. If only even bit lines are being programmed, then all of the memory cells connected to the odd bit lines would be locked-out. This would guarantee a situation where any memory cell being programmed would have both its neighbors locked-out. Although this could cause coupling, since it is guaranteed that both neighbors are locked-out, the coupling is predictable and constant. As a result, over-programming is not likely. The memory cells connected to a word line can be divided into more than two groups and can be divided into types of groups other than odd and even groups.

In step 626 of FIG. 10, a program pulse is applied to the selected word line in order to program only those memory cells connected to even bit lines. Thus, the even bit lines will be at zero volts while the odd bit lines will have Vdd applied. During step 626, only even bit lines will be programmed. After step 626 is performed, step 628 is performed, which includes applying a program pulse to the same selected word line. During step 628, only memory cells connected to odd bit lines will be programmed. Thus, step 628 will include applying zero volts to odd bit lines and Vdd to even bit lines. Thus, steps 626 and 628 include applying two successive program pulses to the same word line (and, thus, to the same set of memory cells connected to that word line); however, only even memory cells are programmed during the first pulse (step 626) and only odd memory cells are programmed during the second pulse (step 628). Therefore, memory cells connected to even bit lines (even memory cells) are programmed separately from memory cells connected to odd bit lines (odd memory cells). For example, if WL2_i is the selected word line (see FIG. 4), then memory cells connected to BL0, BL2, BL4 and WL2_i will be programmed in step 626 and memory cells connected to BL1, BL3, BL5 and WL2_i will be programmed in step 628. Although the odd memory cells receive the program pulse of step 626, they are inhibited from programming during step 626. Although the even memory cells receive program pulses during step 628, they are inhibited from programming during step 628. After step 628, the process loops back to step 612 and memory cells on even bit lines and odd bit lines are all verified together (unless, in some implementations, they have previously been locked out because they reached their target). The process continues from step 612, as described above. There is no verify operation performed between steps 626 and 628.

Figure 12:
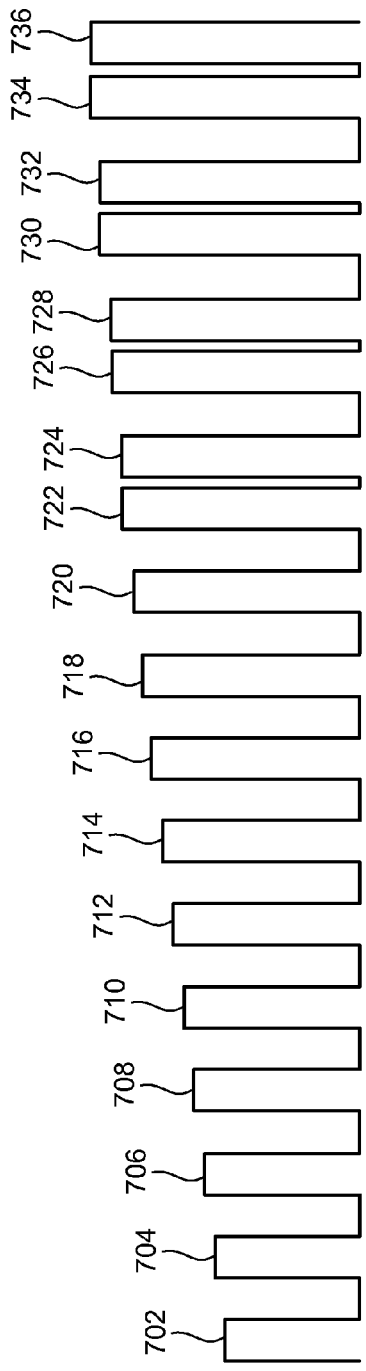
FIG. 12 depicts a set of program pulses.

FIG. 12 is an example waveform for the program voltage Vpgm. The signal of FIG. 12 includes pulses 702, 704, 706, 708, 710, 712, 714, 716, 718, 720, 722, 724, 726, 728, 730, 732, 734 and 736. Program pulses 702-720 are all applied prior to the trigger. Each of the magnitudes of those pulses are less than the trigger voltage. Pulses 702-720 are applied as part of iterations of step 610 of FIG. 10. After applying pulse 720, the trigger voltage has been reached (e.g., the magnitude of Vpgm is greater than the trigger voltage) and the process performs the programming of even bit lines separately from odd bit lines (step 626 and step 628). Therefore, FIG. 12 shows two pulses at 722 and 724. Programming pulse 722 is for programming memory cells connected to even bit lines (step 626) and program pulse 724 is for programming memory cells connected to odd bit lines (step 724); however, both pulses 722 and 724 are both applied to the same selected word line. In the example of FIG. 12, the process continues programming odd and even bit lines separately (first programming even bit lines and subsequently programming odd bit lines). For example, pulses 726 and 728 are the next iteration of steps 626 and 628 of FIG. 10. Pulses 730 and 732 are a subsequent iteration of steps 626 and 628. Pulses 734 and 736 are the final iteration of steps 626 and 628 in the example of FIG. 12. After applying pulses 734 and 736, all memory cells have appropriately verified (or enough memory cells have verified) so that the process is successfully completed.

Figure 13:
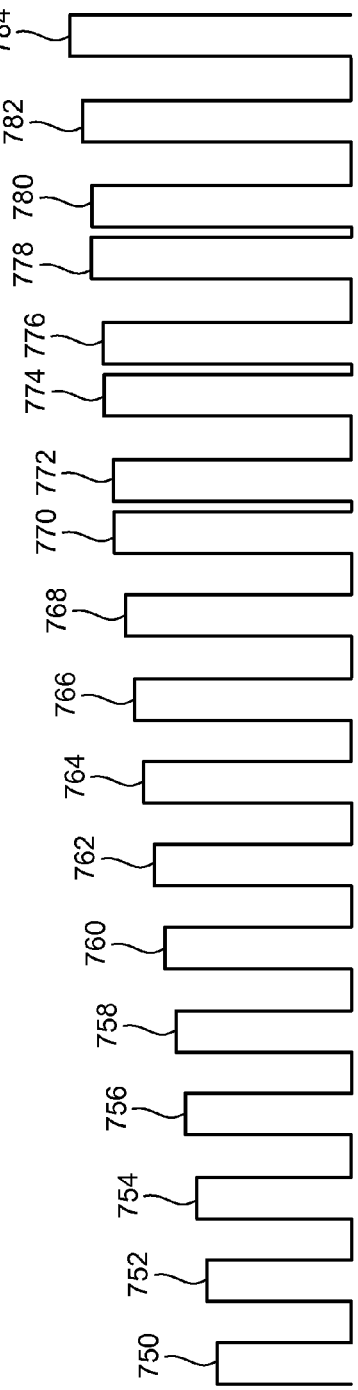
FIG. 13 depicts a set of program pulses.

FIG. 13 provides another example waveform for the programming pulse of Vpgm. The example of FIG. 13 includes the programming process transitioning from all bit line programming (step 610) to separate programming for even and odd bit lines (steps 626 and 628), and then transitioning back to all bit line programming. Programming pulses 750, 752, 754, 756, 758, 760, 762, 764, 766 and 768 are applied during iterations of step 610. After programming pulse 768, the trigger voltage has been reached and the process performs steps 626 and 628 to program memory cells connected to even bit lines with programming pulse 770 and memory cells connected to odd bit lines with programming pulse 772. FIG. 13 shows three iterations of steps 626 and 628. In the second iteration of steps 626 and 628, programming pulse 774 is used to program memory cells connected to even bit lines and program pulse 776 is used to program memory cells connected to odd bit lines. In the third iteration of steps 626 and 628, programming pulse 778 is used to program memory cells connected to even bit lines and programming pulse 780 is used to program memory cells connected to odd bit lines. After applying programming pulse 780 in step 628, it is determined that the incidence of lock-out condition is low. Therefore, after step 624 the process continues at step 610 and a programming pulse 782 is applied to program memory cells connected to all bit lines (except those memory cells that have been locked-out because they have reached their target state). The next iteration of the process of FIG. 10 would include applying one programming pulse 784 in step 610. After applying programming pulse 784, it is determined that enough memory cells have verified and the programming process has completed successfully.

Figure 14:
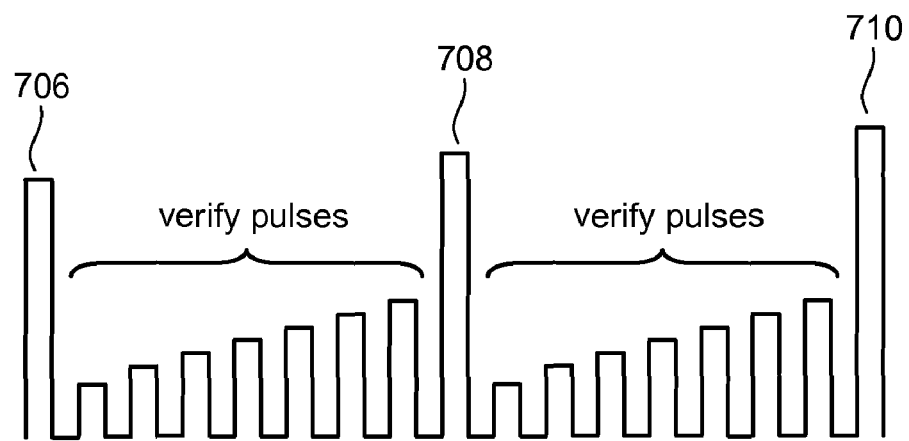
FIG. 14 depicts a set of program pulses and verify pulses.

As described above, a set of verify operations are performed between programming pulses. In one embodiment, a verify pulse is applied to the selected word line for each verify operation. For example, if there are eight potential data states that memory cells can be in, then there will be seven verify operations and, therefore, seven verify pulses. FIG. 14 shows an example of programming pulses 706, 708 and 710 (see also FIG. 12) and the verify pulses that are applied between the programming pulses 706, 708 and 710. Each verify pulse of FIG. 14 is associated with a verify operation, as described above.

Figure 15:
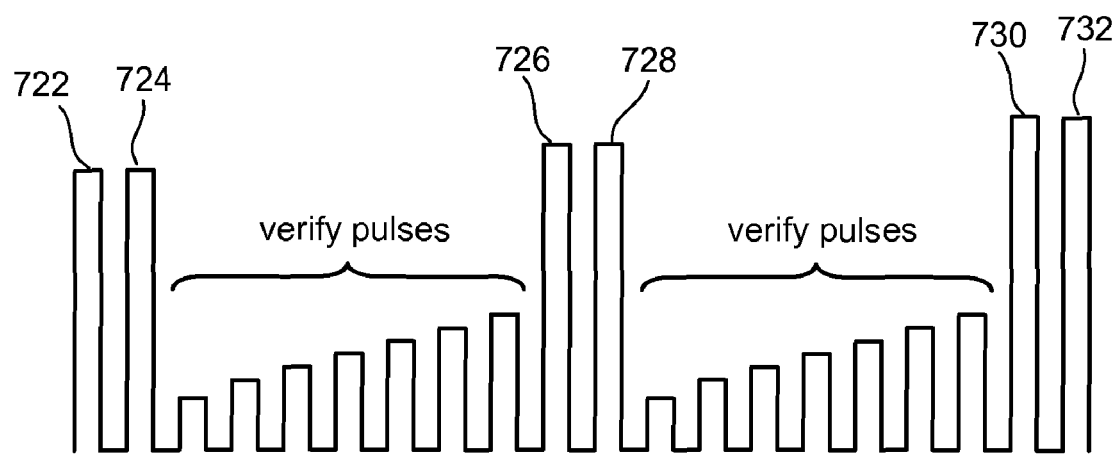
FIG. 15 depicts a set of program pulses and verify pulses.

FIG. 15 also shows programming pulses with verify pulses in between. FIG. 15 shows programming pulses 722, 724, 726, 728, 730 and 732 of FIG. 12. These six programming pulses are associated with applying programming pulses after the trigger voltage has been reached. Therefore, odd and even memory cells are programmed separately. As discussed above, programming pulse 722 programs memory cells connected to even bit lines while programming pulse 724 programs memory cells connected to odd bit lines. In one embodiment, there are no verify operations between programming pulses 722 and 724. Subsequent to program pulse 724 and prior to the next pair of pulses 726, 728, a set of verify pulses are applied in order to perform verify operations. Between pulses 726 and 728, there are no verify operations performed. Subsequent to pulse 728 and prior to the next pair of pulses (730, 732), a set of verify pulses are applied in order to perform a corresponding set of verify operations.

Figure 16:
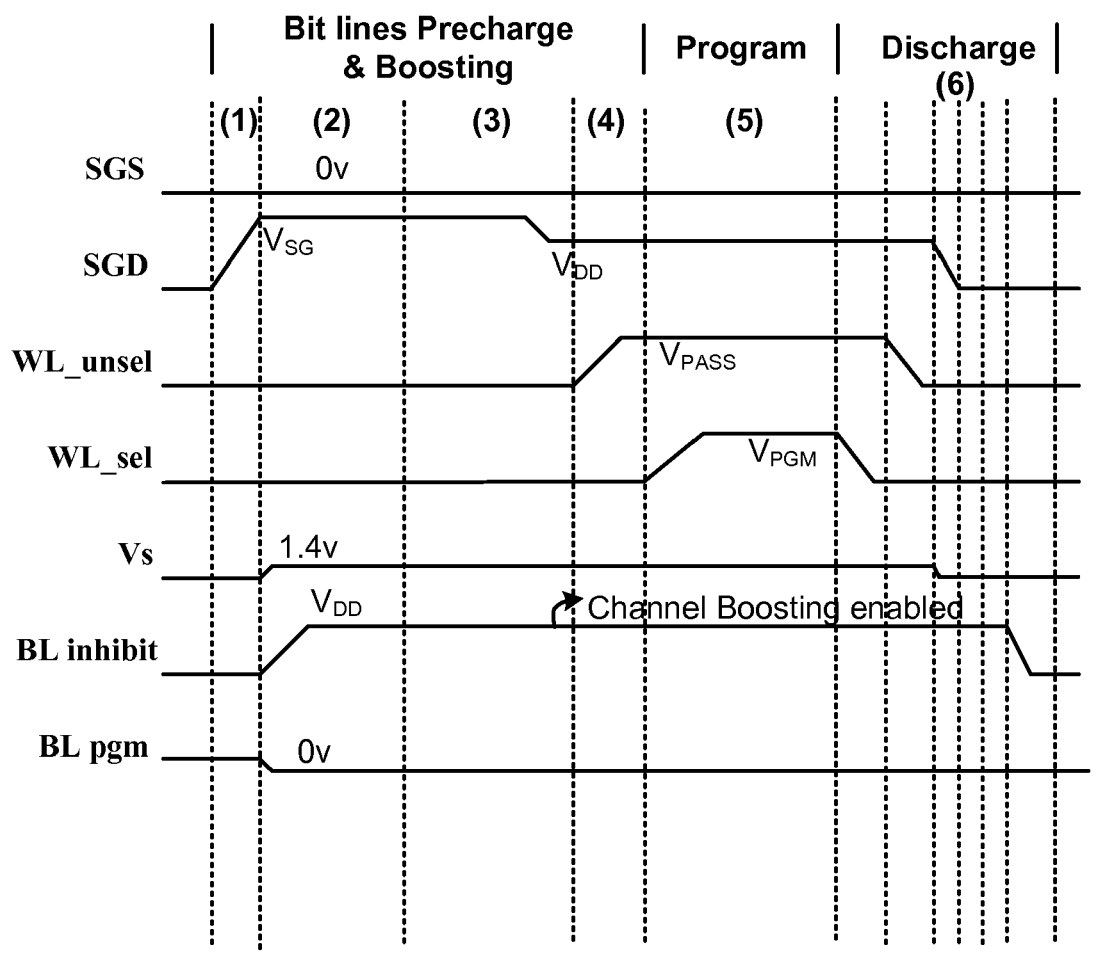
FIG. 16 depicts example waveforms.

FIG. 16 depicts the behavior various signals during programming. More specifically, Figure shows the operation during one iteration of steps 610, 626 or 628 of FIG. 10. The depicted program operation can be grouped into a Bit Lines Pre-charge Phase, a Program Phase and a Discharge Phase.

During period (1) of the Bit Lines Pre-charge Phase, the source select transistor is turned off by maintaining SGS at 0V while the drain select transistor is turned on by SGD going high to $V_{SG}$, thereby allowing a bit line to access a NAND string. During period (2) of the Bit Lines Pre-charge Phase, the bit line voltage of a program-inhibited NAND string (BL inhibit) is allowed to rise to a predetermined voltage given by $V_{DD}$. When the bit line voltage of the program-inhibited NAND string rises to $V_{DD}$, the program-inhibited NAND string will float when the gate voltage SGD on the drain select transistor drops to $V_{DD}$ in period (3). The bit line voltage of a programming NAND string (BL pgm) is actively pulled down to 0V. In some alternative embodiments, the bit line voltage of the programming NAND string is biased based on whether one or both of its neighbors is in program-inhibit mode or not. More information about this bias can be found in U.S. Pat. No. 7,187,585, incorporated herein by reference in its entirety.

During period (4) of the Program Phase, the unselected word lines (WL_unsel) are set to VPASS to enable boosting of the NAND string. Since a program-inhibited NAND string is floating, the high VPASS applied to the control gates of the unaddressed memory transistors boost up the voltages of their channels and charge storage elements, thereby inhibiting programming. VPASS is typically set to some intermediate voltage (e.g., ~10V) relative to Vpgm (e.g., ~12-24V).

During period (5) of the Program Phase, the programming voltage Vpgm is applied to the selected word line (WL_sel) as a programming pulse. The programming pulse of period (5) corresponds to any of the pulses 702-736 of FIG. 12 or pulses 750-784 of FIG. 13. The memory cells being inhibited (i.e., with boosted channels and charge storage units) will not be programmed. The selected memory cells (connected to the selected word line) will be programmed. During period (6) of the Discharge Phase, the various control lines and bit lines are allowed to discharge.

Figure 17:
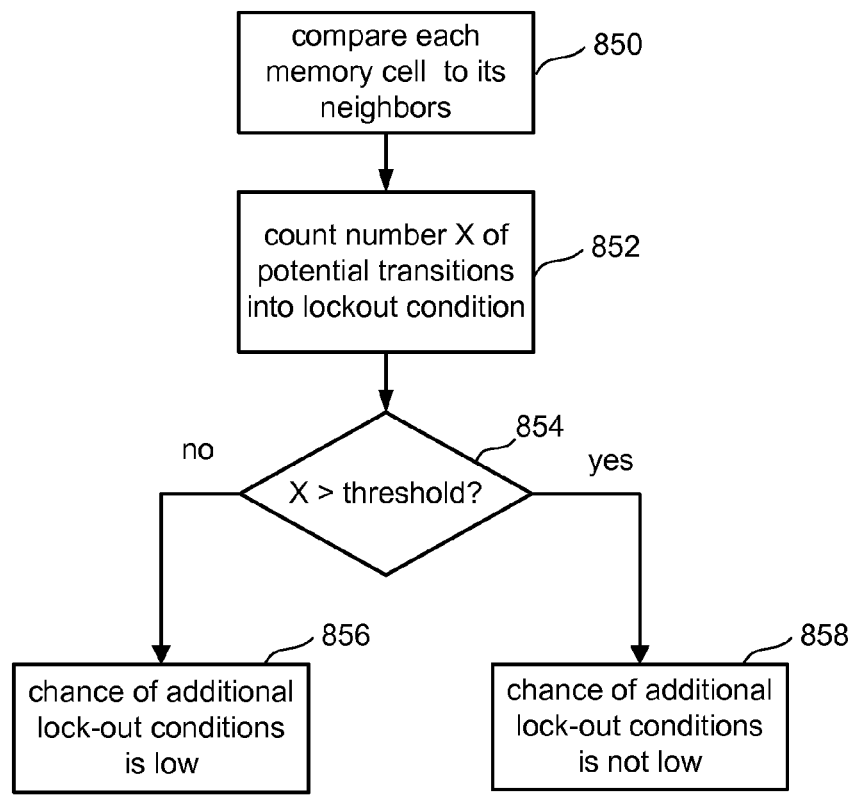
FIG. 17 is a flow chart describing one embodiment of a process for determining whether a condition exists.

FIG. 17 is a flow chart describing one embodiment of a process for determining whether the chance of additional lock-out conditions is low (see step 624 of FIG. 10). In step 850, each memory cell is compared to its neighboring memory cell along the same word line. In step 852, the system counts the number X of potential transitions into lock-out condition. A potential lockout condition exists if two neighbor memory cells are both still being programmed because one of the neighbors can potentially reach its target before the other and lockout. Thus, in one embodiment, step 852 includes counting the number of pairs of neighboring memory cells that are still being programmed. If the number of potential lockout conditions is greater than a threshold (step 854), then the chance of additional lock-out conditions is not low (step 858). If the number of potential lockout conditions is not greater than a threshold, then the chance of additional lock-out conditions is low (step 856). The threshold of step 854 is set based on the number of bits that can be corrected by error correction codes. For example, one embodiment includes an error correction code that can fix up to seven bits of incorrect data (amounting to approximately 0.01 percent of the data). Thus, if the number of potential lockout conditions is less than seven, then the chance of additional lock-out conditions is low (step 856). Other thresholds can also be used. In another embodiment, step 850 would include only a subset of memory cells being compared to their neighbors, and the results would be extrapolated for the entire population and compared to the threshold.

Figure 18:
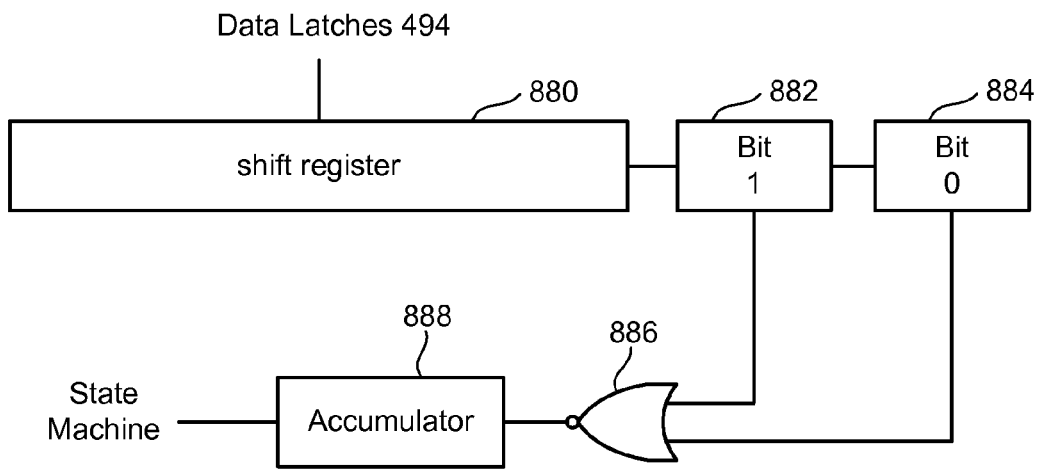
FIG. 18 is a block diagram of one embodiment of a circuit that determines whether a condition exists.

FIG. 18 is a block diagram of one example of hardware that can implement the process of FIG. 17. Data latches 494 (see FIG. 5) for all the memory cells provide data to shift register

880. In one embodiment, shift register 880 can include the actual data latches 494. Shift register 880 includes all the data for all of the bit lines. The data is shifted out one bit at a time, first into one bit register 882 and then into one bit register 884. The data in register 882 and the data from register 884 are sent to NOR gate 886. The output of NOR gate 886 is sent to accumulator 888. The output of accumulator 888 is provided to state machine 222, which determines whether the number of potential lockout conditions is not greater than a threshold. The circuit of FIG. 18 counts the incidences where neighboring bit lines store 0-0. In one example, to configure the sense circuitry to apply the appropriate voltage on the bit line, a data latch is used to store an indication of whether the particular memory cell should be programmed or inhibited from programming. In one embodiment, the respective data latch will store one (1) if the bit line is to be inhibited and will store zero (0) if the bit line is to be set up for programming. Opposite polarities can also be used. Thus, the circuit of FIG. 18 will look for neighboring bit lines where the data are 0-0 and count the number of times that happens using accumulator 888. If the number of times that the accumulator 888 counts 0-0 is greater than the threshold, then the state machine concludes that the chance of additional lock-out conditions is not low (and, in FIG. 10, the process would continue at step 626).

Figure 19:
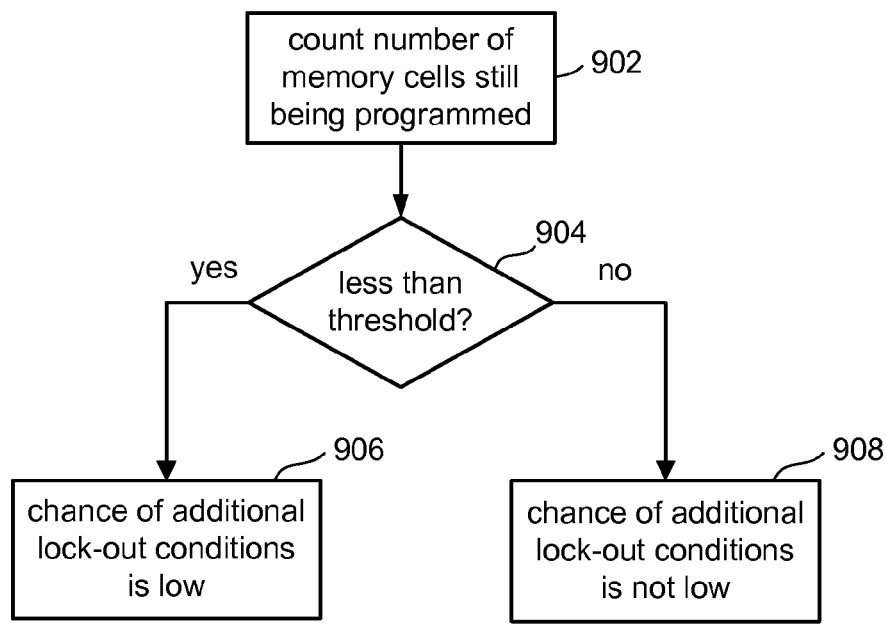
FIG. 19 is a flow chart describing one embodiment of a process for determining whether a condition exists.

FIG. 19 describes another embodiment of determining whether the chance of additional lock-out conditions is low. In step 902, the number of memory cells that are still being programmed are counted. In an alternative, the number of memory cells that are locked out are counted. In step 904, it is determined whether the number of memory cells still being programmed is less than a threshold. If the number of memory cells still being programmed is less than the threshold (step 904), then the chance of additional lock-out conditions is low (step 906). If the number of memory cells being locked-out is not less than the threshold, then the chance of additional lock-out conditions is not low (step 908). In one embodiment, the threshold could be set so that if only 0.4% of the memory cells are still being programmed (or 99.6% are locked out) then the chance of additional lock-out conditions is low. Other thresholds can also be used.

Figure 20:
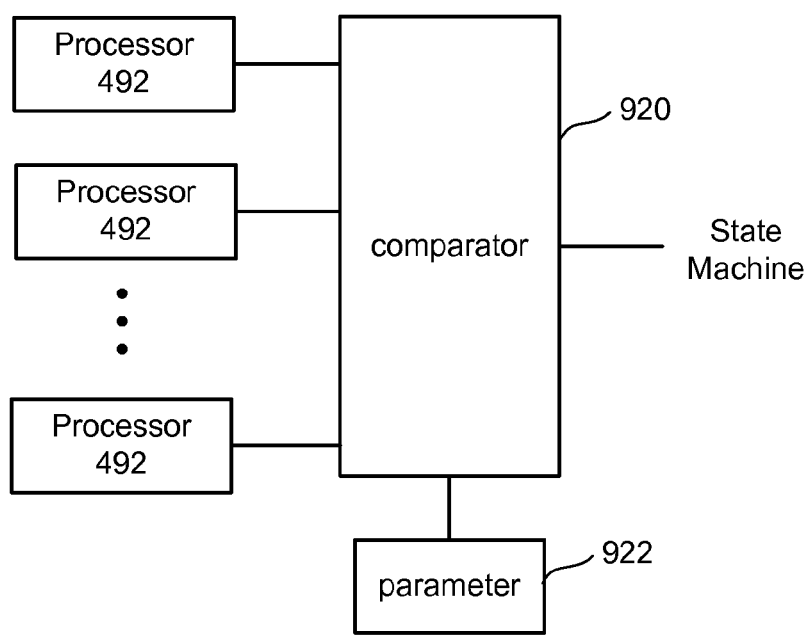
FIG. 20 is a block diagram of one embodiment of a circuit that determines whether a condition exists.

FIG. 20 is a block diagram depicting one example of hardware that can be used to implement the process of FIG. 19. FIG. 20 shows each of the processors 492 for each of the groups of bit lines (e.g., one processor 492 for 8 bit lines) in communication with a comparator circuit 920. Each of the processors will indicate whether their respective bit lines are being programmed or locked-out. Comparator 920 includes a circuit for counting the number of bit lines that are locked out. In one embodiment, this can be accomplished by providing the data from the latches discussed above. Comparator 920 can access a parameter 922 which indicates the threshold (see step 904) and compare that threshold to the sum of bit lines locked out. The output of comparator 920 is sent to state machine 222.

Looking back at FIG. 10, a trigger is used (step 622) to change the programming process from programming odd and even memory cells together to programming odd and even memory cells separately. One embodiment includes using device characterization (including simulation) to determine an appropriate trigger voltage. In some embodiments, the trigger voltage can be trimmed separately for each integrated circuit. That is, subsequent to manufacturing the integrated circuits, each integrated circuit can be tested. Based on that test, the trigger voltage can be set or adjusted.

Figure 23:
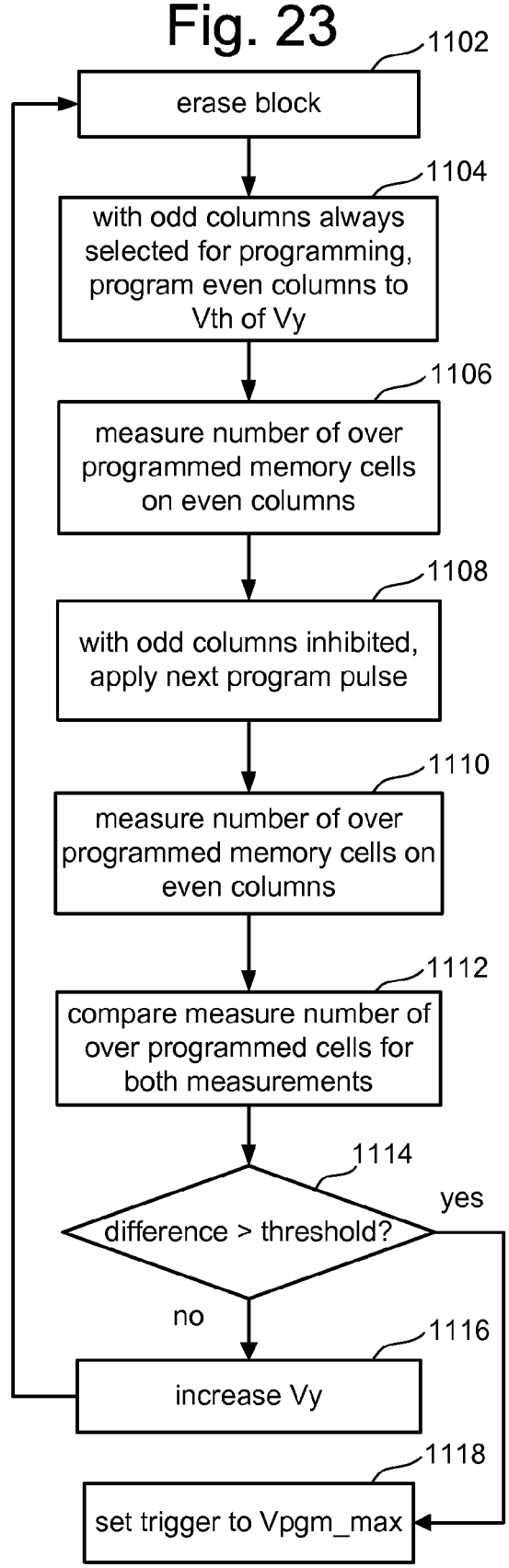
FIG. 23 is a flow chart describing one embodiment of a process for determining a trigger point to change the programming process.

FIGS. 21, 22 and 23 are flow charts describing three embodiments for trimming or setting the trigger value. The processes of FIGS. 21-23 can be performed on one block. The data from that one block can then be used for all the blocks on that memory device. In one alternative, multiple blocks can be tested and the results applied to all blocks. In another alternative embodiment, the processes of FIG. 21-23 can be performed on every block and each block will then have its own trigger value. In one embodiment, only one word line is tested in a block. In other embodiments, more than one word line can be tested and the results averaged or otherwise combined. In other implementations, other units (e.g., word line, groups of word lines, page, sector, etc.) can be selected for testing.

In step 1002 of FIG. 21, the particular block (or blocks) under test is erased. The process will then program the even cells on one selected word line. In one embodiment, only one word line will receive programming. Based on that one word line, a new trigger value will be determined for the entire block, entire chip, or the entire memory system. In other embodiments, multiple word lines can be programmed and the data can be averaged or each word line can have its own trigger value. In step 1004, memory cells connected to the selected word line are programmed. The programming process of step 1004 includes all of the memory cells connected to the odd bit lines and even bit lines be enabled for programming and applying programming pulses with increasing magnitude until the programming pulses reach a magnitude of Vpgm_test. In one embodiment, the Vpgm_test is initially set at two volts below the trigger voltage determined from device characterization. The programming process of step 1004 is similar to the process of FIG. 10 with the exception that after step 620, the process always loops back to step 610 (there is no step 622-628). After the programming process of step 1004 is complete, then the top and bottom of the threshold voltage distribution for the memory cells connected to even bit lines are measured in step 1006. In step 1008, the block is erased.

In step 1010, the memory cells connected to the even bit lines are again programmed; however, the memory cells connected to the odd bit lines are inhibited from programming for all of the programming pulses of step 1010. Step 1010 includes applying a series of programming pulses with increasing magnitude until the magnitude of a program pulse is equal to the same Vpgm_test as step 1004. In step 1012, the threshold voltage distribution to the memory cells connected to the even bit lines is measured. In step 1014, the top and bottom of the threshold voltage distributions measured in steps 1012 and 1006 are compared. In one embodiment, the lower bounds of the two threshold voltage distributions are compared. In another embodiment, the upper bounds of each threshold voltage distribution are compared. If the difference between the lower bounds (or upper bounds) of the threshold voltage distributions is not greater than a threshold, then Vpgm_test is increased by a predetermined amount (e.g., 0.5 volts or other value) and the process repeats by looping back to step 1002. If the difference between the lowest points of the two threshold voltage distributions is greater than a threshold, then the trigger voltage (from the value determined by device characterization) is modified to become the current value of Vpgm_test in step 1020. In some embodiments, Vpgm_test can be further modified by adding some margining offset to account for consideration that the sample size may not capture the actual worst case. In one embodiment, the threshold of step 1016 is equal to 0.5 volts and the program pulse step size used for programming in steps 1004 and 1010 is 0.4 volts.

FIG. 22 provides another embodiment of a process for determining or trimming the trigger voltage. In step 1050, the block under consideration is erased. With the memory cells connected to the odd bit lines selected for programming in each iteration of the programming process, the memory cells connected to the even bit lines are programmed until their threshold voltage reaches a target level of Vx volts in step 1052. Vx can be set by experimentation. One example value of Vx is 3.5 volts. In step 1054, the number of programming pulses needed to properly program the memory cells connected to even bit lines during step 2052 is recorded. In step 1056, the block under consideration is erased. In step 1058, the memory cells connected to even bit lines are programmed again until their threshold voltage has reached Vx volts. In step 1058, the memory cells connected to the odd bit lines are always inhibited for each cycle. In step 1060, the number of program pulses needed to program the memory cells in step 1058 is recorded. In step 1062, the number of pulses for each of the tests (steps 1054 and 1060) are compared. It is predicted that the number of pulses measured in step 1060 will be fewer than the number of pulses measured in step 1054. This difference in number of pulses indicates a magnitude of the interference effect associated with the lock-out condition described above. If the difference is greater than a threshold, then the trigger voltage is set to the magnitude of the last pulse from the programming process of step 1058. If the difference is not greater than the threshold, then the voltage VX is increased (e.g., by 0.5 volts) and the process loops back to step 1050 to repeat the tests. In one example, the threshold of step 1064 is equal to one pulse. Other thresholds can also be used.

FIG. 23 is another embodiment for determining or trimming the trigger voltage. In step 1102, the selected block or blocks are erased. In step 1104, the memory cells connected to even bit lines are programmed until their threshold voltage is equal to a voltage Vy. During the programming process of step 1104, the memory cells connected to the odd bit lines are always selected for programming. In step 1106, the number of memory cells connected to even bit lines that are over-programmed are measured. For example, an ideal threshold voltage distribution can be estimated based on simulation and an upper level can be determined for that ideal threshold voltage distribution. If the threshold voltage of a memory cell exceeds an upper limit of that ideal distribution, that memory cell is over programmed. For example, looking at FIG. 7I, state S6 has a lower bound G and an upper bound OP. If a memory cell has a threshold voltage greater than OP, then that memory cell is over-programmed. In other embodiments, the compare level for over-programming could be different.

Looking back at FIG. 23, in step 1108, one more programming pulse is applied to the selected word line. While that programming pulse is being applied at step 1108, all memory cells connected to odd bit lines are inhibited from programming. Those memory cells that reached threshold voltage of Vy in step 1104 will remain locked-out during step 1108. Thus, the programming pulse of step 1108 will only program those memory cells which had not already reached a threshold voltage of Vy. In step 1110, the number of over-programmed memory cells is again measured. In step 1112, the number of over-programmed cells measured in step 1110 is compared to the number of over-programmed memory cells measured in step 1106. If the difference in the number of over-programmed memory cells is greater than a threshold, then the trigger voltage is set to the magnitude of the pulse applied in step 1108. One example of a threshold from step 1114 is five memory cells. If the difference is not greater than the threshold (step 1114), then the voltage level of Vy is increased (e.g., by 0.5 volts) at step 1116 and the process loops back to step 1102 and repeats.

Figure 24:
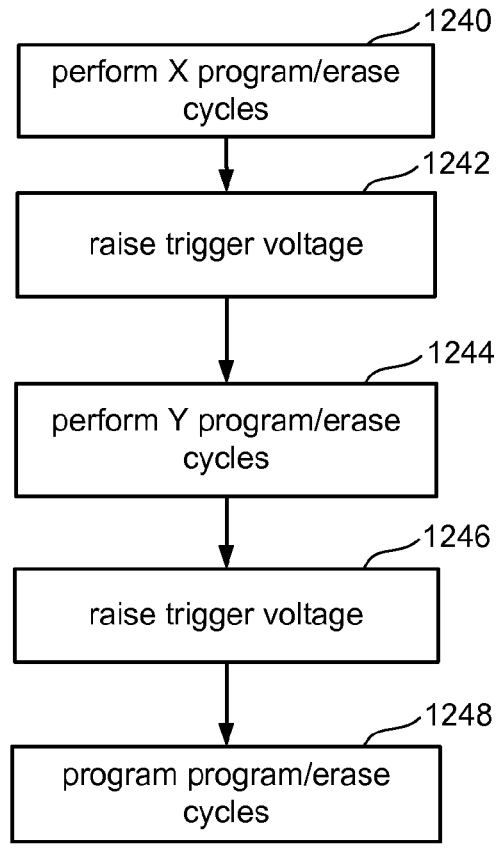
FIG. 24 is a flow chart describing one embodiment of a process for dynamically adjusting a trigger voltage.

In some embodiments, a non-volatile storage system can make dynamic adjustments to the triggering voltage in order to account for changes due to environmental or usage conditions, such as cycling history, temperature, etc. FIG. 24 is a flow chart describing one embodiment for dynamically changing the trigger voltage based on the number of program/erase cycles. A program/erase cycle includes performing an erase process and a program process. As the non-volatile storage system performs many programming/erase cycles, charge may get trapped in the dielectric region between the floating gate and the channel. This condition may decrease the depletion region discussed above with respect to FIGS. 11A-C. Therefore, as the device becomes cycled many times, it may be possible to increase the trigger voltage so that the separate programming of odd and even memory cells happens later in the programming process. In step 1240 of FIG. 24, the memory device performs X program/erase cycles. In one example, X program cycles could be 10,000 program/erase cycles. Other values for X could also be used. After performing X program/erase cycles, the trigger voltage is raised (e.g., by 0.5 volts) in step 1242. After raising the trigger voltage in step 1242, the memory system will perform Y program/erase cycles in step 1244. In one example, Y program/erase cycles could be 5,000 program/erase cycles. In step 1246, the trigger voltage will again be raised (e.g., by 0.2 volts). After raising the trigger voltage in step 1246, the memory system will continue performing program/erase cycles (step 1248). FIG. 24 shows the memory device raising the trigger voltage twice. However, in other embodiments, the trigger voltage can be raised only once or more times than twice. Different values of X and Y can be determined based on device characterization or experimental means.

Figure 25:
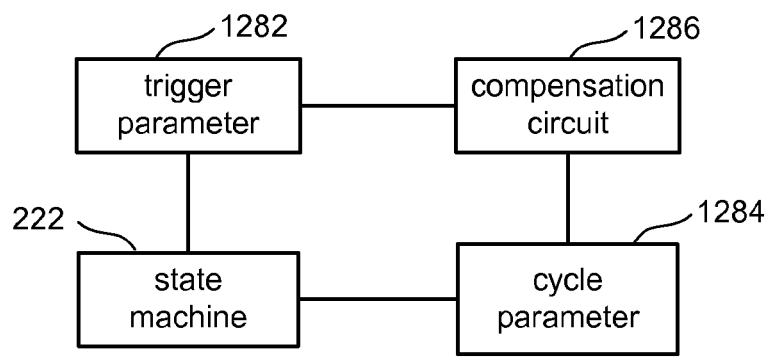
FIG. 25 is a block diagram illustrating some of the components that implement the process of FIG. 24.

FIG. 25 is a block diagram of one example of components used to perform the process of FIG. 24. FIG. 25 shows state machine 222 in communication with register 1282 storing a trigger parameter and register 1284 storing a cycle parameter. Compensation circuit 1286 is also in communication with register 1282 and register 1284. The trigger parameter is an indication of the trigger voltage (or other trigger). The trigger parameter can be an identification of a voltage magnitude, a pulse number, or something else. The cycle parameter can indicate the number or program/erase cycles that have been performed. Based on the value of the cycle parameter, the compensation circuit will update the trigger parameter, when appropriate. For example, compensation circuit 1286 may update the trigger parameter as part of step 1242 and 1246 of FIG. 24. State machine 222 will use the trigger parameter during step 622 of FIG. 10.

Figure 26:
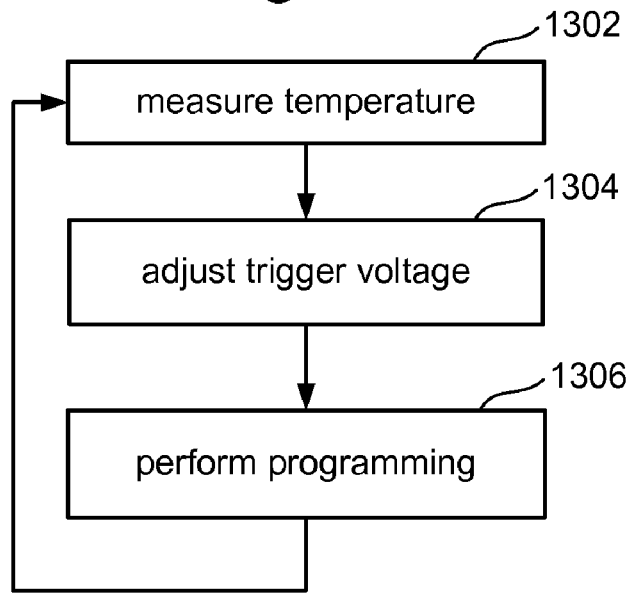
FIG. 26 is a flow chart describing one embodiment of a process for dynamically adjusting a trigger voltage.

FIG. 26 is a flow chart describing an embodiment for dynamically adjusting the trigger voltage based on temperature. In step 1302, the memory system will measure the temperature. In one embodiment, the memory system can include a temperature sensor. Based on the measured temperature, the trigger voltage can be adjusted in step 1304. It is anticipated that the depletion region should be worse at cold temperatures so the trigger should happen earlier in the program process. This can be done by lowering the trigger voltage when there is a cold temperature. If the temperature measured in step 1302 is colder than a preset number, the trigger voltage can be lowered. If the temperature measured in step 1302 is higher than the preset number, then the trigger voltage can be raised. In another embodiment, state machine 222 can store a table which associates ranges of temperature with trigger voltages. In step 1302, state machine 222 will read the temperature and in step 1304, state machine 222 will look up a trigger value in a table using the temperature as a key to the table. The trigger voltage found in the table will be stored in a parameter for use during the programming process. In another embodiment, a compensation circuit will read the measured temperature and adjust the trigger voltage in step 1304. In step 1306, the system will perform programming using the trigger voltage set in step 1304. After a certain amount of performing programming, the process will loop back to step 1302, the temperature will be measured again and the trigger value can be optionally adjusted in step 1304. In one embodiment, the loop of steps 1302-1306 can be performed for every programming process. In alternative embodiments, the process can be performed every N cycles or every N time periods, etc.

Figure 27:
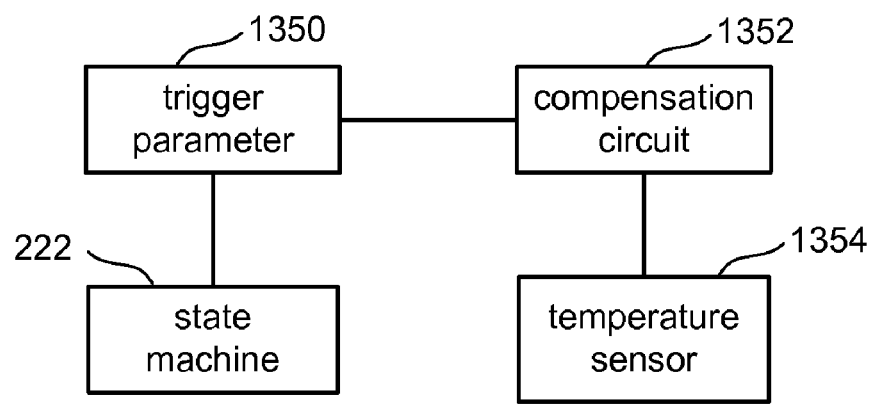
FIG. 27 is a block diagram illustrating some of the components that implement the process of FIG. 26.

FIG. 27 is a block diagram depicting one example of components that can implement the process of FIG. 26. FIG. 27 shows state machine 222 in communication with register 1350 storing a trigger parameter. The trigger parameter is an indication of the trigger voltage (or other trigger). The trigger parameter can be an identification of a voltage magnitude, a pulse number, or something else. Compensation circuit 1352 is in communication with register 1350 and temperature sensor 1354. Temperature sensor 1354 outputs a signal (voltage or current) indicative of temperature. Based on the output of temperature sensor 1354, compensation circuit 1352 will update the trigger parameter. For example, compensation circuit 1352 may update the trigger parameter as part of step 1304 of FIG. 26. The update of the trigger parameter may be performed continuously, periodically, or on demand.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming non-volatile storage, comprising:
   performing programming on a first group of non-volatile storage elements at a first time;
   performing programming on a second group of non-volatile storage elements at a second time different from said first time;
   said performing programming on said first group of non-volatile storage elements at said first time and said performing programming on said second group of non-volatile storage elements at said second time are performed after and in response to a first trigger; and
   said method further comprises performing one or more program cycles prior to said first trigger, each of said one or more program cycles includes programming said first group of non-volatile storage elements and said second group of non-volatile storage elements together.

2. A method according to claim 1, wherein:
   said first group of non-volatile storage elements are connected to a first control line; and
   said second group of non-volatile storage elements are connected to said first control line.

3. A method according to claim 1, wherein:
   said first group of non-volatile storage elements are connected to a word line;
   said second group of non-volatile storage elements are connected to said word line; and
   each non-volatile storage element of said first group of non-volatile storage elements and said second group of non-volatile storage elements are connected to different bit lines in an interleaving manner.

4. A method according to claim 1, wherein:
   said performing programming on said first group of non-volatile storage elements includes applying a first program pulse to said first group of non-volatile storage elements and said second group of non-volatile storage elements, inhibiting said second group of non-volatile storage elements from programming in response to said first program pulse, and allowing said first group of non-volatile storage elements to program in response to said first program pulse; and
   said performing programming on said second group of non-volatile storage elements includes applying a second program pulse to said first group of non-volatile storage elements and said second group of non-volatile storage elements, inhibiting said first group of non-volatile storage elements from programming in response to said second program pulse, and allowing said second group of non-volatile storage elements to program in response to said second program pulse.

5. A method according to claim 4, wherein:
   each non-volatile storage element of said first group of non-volatile storage elements and said second group of non-volatile storage elements are connected to different control lines;
   said control lines include even control lines and odd control lines; and
   said first group of non-volatile storage elements are connected to said even control lines; and
   said second group of non-volatile storage elements are connected to said odd control lines.

6. A method according to claim 5, wherein:
   said first group of non-volatile storage elements is arranged in an interleaving manner with said second group of non-volatile storage elements.

7. A method according to claim 1, wherein:
   said first group of non-volatile storage elements and said second group of non-volatile storage elements do not have any non-volatile storage elements in common.

8. A method for programming non-volatile storage, comprising:
   performing programming on a first group of non-volatile storage elements at a first time
   performing programming on a second group of non-volatile storage elements at a second time different from said first time
   verifying said first group of non-volatile storage elements and said second group of non-volatile storage elements together;
   said performing programming on said first group of non-volatile storage elements at said first time and said performing programming on said second group of non-volatile storage elements at said second time are performed after and in response to a first trigger; and
   said method further comprises performing one or more program cycles prior to said first trigger, each of said one or more program cycles includes programming said first group of non-volatile storage elements and said second group of non-volatile storage elements together.

9. A method according to claim 8, wherein:
   said first trigger includes a programming pulse magnitude reaching a trigger voltage.

10. A method according to claim 9, further comprising:
    determining said trigger voltage for said first group of non-volatile storage elements and said second group of non-volatile storage elements subsequent to manufacture of said first group of non-volatile storage elements and said second group of non-volatile storage elements.

11. A method according to claim 8, wherein:
said performing programming on said first group of non-volatile storage elements at said first time and said performing programming on said second group of non-volatile storage elements at said second time are performed prior to a second trigger; and
said method further comprises performing one or more additional cycles subsequent to said second trigger, each of said one or more additional cycles includes programming said first group of non-volatile storage elements and said second group of non-volatile storage elements together.

12. A method according to claim 8, wherein:
said first group of non-volatile storage elements are connected to a first word line;
said second group of non-volatile storage elements are connected to said word line; and
each non-volatile storage element of said first group of non-volatile storage elements and said second group of non-volatile storage elements are connected to different bit lines in an interleaving manner.

13. A method according to claim 12, further comprising:
said performing programming on said first group of non-volatile storage elements includes applying a first program pulse to said first group of non-volatile storage elements and said second group of non-volatile storage elements, inhibiting said second group of non-volatile storage elements from programming in response to said first program pulse, and allowing said first group of non-volatile storage elements to program in response to said first program pulse; and
said performing programming on said second group of non-volatile storage elements includes applying a second program pulse to said first group of non-volatile storage elements and said second group of non-volatile storage elements, inhibiting said first group of non-volatile storage elements from programming in response to said second program pulse, and allowing said second group of non-volatile storage elements to program in response to said second program pulse.

14. A method according to claim 8, further comprising:
dynamically adjusting said first trigger during operation of said first group of non-volatile storage elements and said second group of non-volatile storage elements.

15. A method according to claim 8, further comprising:
adjusting said first trigger based on program-erase cycles.

16. A method according to claim 8, further comprising:
adjusting said first trigger based on temperature.

17. A method for programming non-volatile storage, comprising:
performing programming on a first group of non-volatile storage elements at a first time;
performing programming on a second group of non-volatile storage elements at a second time different from said first time;
verifying said first group of non-volatile storage elements and said second group of non-volatile storage elements together;
said performing programming on said first group of non-volatile storage elements at said first time and said performing programming on said second group of non-volatile storage elements at said second time are performed prior to and until a condition is detected; and
said method further comprises performing one or more additional cycles subsequent to said condition being detected, each of said one or more additional cycles includes programming said first group of non-volatile storage elements and said second group of non-volatile storage elements together.

18. A method according to claim 17, further comprising:
determining how many of said first group of non-volatile storage elements and said second group of non-volatile storage elements are still being programmed and have a neighbor that is selected for programming; and
detecting said condition based on how many of said first group of non-volatile storage elements and said second group of non-volatile storage elements are still being programmed and have a neighbor that is selected for programming.

19. A method according to claim 17, further comprising:
determining how many of said first group of non-volatile storage elements and said second group of non-volatile storage elements are still being programmed and have a neighbor that is selected for programming using extrapolation; and
detecting said condition based on how many of said first group of non-volatile storage elements and said second group of non-volatile storage elements are still being programmed and have a neighbor that is selected for programming.

20. A method according to claim 17, further comprising:
determining how many of said first group of non-volatile storage elements and said second group of non-volatile storage elements are still being programmed; and
detecting said condition based on how many of said first group of non-volatile storage elements and said second group of non-volatile storage elements are still being programmed.

21. A method according to claim 1, wherein:
said first group of non-volatile storage elements and said second group of non-volatile storage elements are flash memory devices.

22. A method according to claim 1, wherein:
said first group of non-volatile storage elements and said second group of non-volatile storage elements are NAND flash memory devices.

23. A non-volatile storage apparatus, comprising:
a plurality of non-volatile storage elements including a first group of non-volatile storage elements and a second group of non-volatile storage elements; and
one or more managing circuits in communication with said non-volatile storage elements, said one or more managing circuits program said first group of non-volatile storage elements separately from programming said second group of non-volatile storage elements after and in response to a first trigger, said one or more managing circuits program said first group of non-volatile storage elements together with said second group of non-volatile storage elements prior to said first trigger.

24. A non-volatile storage apparatus according to claim 23, further comprising:
a control line, said first group of non-volatile storage elements are connected to said control line and said second group of non-volatile storage elements are connected to said control line.

25. A non-volatile storage apparatus according to claim 23, further comprising:
a word line, said first group of non-volatile storage elements are connected to said word line and said second group of non-volatile storage elements are connected to said word line; and
bit lines, each non-volatile storage element of said first group of non-volatile storage elements and said second group of non-volatile storage elements are connected to different bit lines in an interleaving manner.

26. A non-volatile storage apparatus according to claim 23, wherein:
said one or more managing circuits program said first group of non-volatile storage elements separately from programming said second group of non-volatile storage elements by applying a first program pulse to said first group of non-volatile storage elements and said second group of non-volatile storage elements while inhibiting said second group of non-volatile storage elements from programming and applying a second program pulse to said first group of non-volatile storage elements and said second group of non-volatile storage elements while inhibiting said first group of non-volatile storage elements from programming.

27. A non-volatile storage apparatus according to claim 23, wherein:
said first group of non-volatile storage elements and said second group of non-volatile storage elements do not have any non-volatile storage elements in common.

28. A non-volatile storage apparatus according to claim 23, further comprising:
control lines, each non-volatile storage element of said first group of non-volatile storage elements and said second group of non-volatile storage elements are connected to different control lines, said control lines include even control lines and odd control lines, said first group of non-volatile storage elements are connected to said even control lines, said second group of non-volatile storage elements are connected to said odd control lines.

29. A non-volatile storage apparatus according to claim 23, wherein:
said first group of non-volatile storage elements is arranged in an interleaving manner with respect to said second group of non-volatile storage elements.

30. A non-volatile storage apparatus, comprising:
a plurality of non-volatile storage elements including a first group of non-volatile storage elements and a second group of non-volatile storage elements; and
one or more managing circuits in communication with said non-volatile storage elements, said one or more managing circuits program said first group of non-volatile storage elements separately from programming said second group of non-volatile storage elements, said one or more managing circuits verify said first group of non-volatile storage elements together with verifying said second group of non-volatile storage elements, said one or more managing circuits program said first group of non-volatile storage elements separately from programming said second group of non-volatile storage elements after and in response to a first trigger, said one or more managing circuits program said first group of non-volatile storage elements together with said second group of non-volatile storage elements prior to said first trigger.

31. A non-volatile storage apparatus according to claim 30, wherein:
said first trigger includes a voltage level for a program pulse concurrently applied to said first group of non-volatile storage elements and said second group of non-volatile storage elements.

32. A non-volatile storage apparatus according to claim 30, wherein:
said one or more managing circuits program said first group of non-volatile storage elements separately from programming said second group of non-volatile storage elements prior to a second trigger; and
said one or more managing circuits program said first group of non-volatile storage elements together with said second group of non-volatile storage elements together subsequent to and in response to said second trigger.

33. A non-volatile storage apparatus according to claim 30, further comprising:
a word line, said first group of non-volatile storage elements are connected to said word line and said second group of non-volatile storage elements are connected to said word line; and
bit lines, each non-volatile storage element of said first group of non-volatile storage elements and said second group of non-volatile storage elements are connected to different bit lines.

34. A non-volatile storage apparatus according to claim 33, wherein:
said one or more managing circuits program said first group of non-volatile storage elements separately from programming said second group of non-volatile storage elements by applying a first program pulse to said first group of non-volatile storage elements and said second group of non-volatile storage elements while inhibiting said second group of non-volatile storage elements from programming and applying a second program pulse to said first group of non-volatile storage elements and said second group of non-volatile storage elements while inhibiting said first group of non-volatile storage elements from programming.

35. A non-volatile storage apparatus according to claim 30, wherein:
said one or more managing circuits dynamically adjust said first trigger.

36. A non-volatile storage apparatus according to claim 30, wherein:
said one or more managing circuits adjust said first trigger based on temperature.

37. A non-volatile storage apparatus according to claim 30, wherein:
said one or more managing circuits adjust said first trigger based on number of program cycles.

38. A non-volatile storage apparatus, comprising:
a plurality of non-volatile storage elements including a first group of non-volatile storage elements and a second group of non-volatile storage elements; and
one or more managing circuits in communication with said non-volatile storage elements, said one or more managing circuits program said first group of non-volatile storage elements separately from programming said second group of non-volatile storage elements, said one or more managing circuits verify said first group of non-volatile storage elements together with verifying said second group of non-volatile storage elements, said one or more managing circuits program said first group of non-volatile storage elements separately from programming said second group of non-volatile storage elements prior to detecting a condition, said one or more managing circuits program said first group of non-volatile storage elements together with said second group of non-volatile storage elements together subsequent to and in response to detecting said condition.

39. A non-volatile storage apparatus according to claim 23, wherein:
said first group of non-volatile storage elements and said second group of non-volatile storage elements are flash memory devices.

40. A non-volatile storage apparatus according to claim 23, wherein:
said first group of non-volatile storage elements and said second group of non-volatile storage elements are NAND flash memory devices.

41. A non-volatile storage apparatus, comprising:
a plurality of non-volatile storage elements;
means for performing programming on a first group of said non-volatile storage elements at a first time and for performing programming on a second group of said non-volatile storage elements at a second time different from said first time, said performing programming on said first group of non-volatile storage elements at said first time and said performing programming on said second group of non-volatile storage elements at said second time are performed after and in response to a first trigger;
means for performing one or more program cycles prior to said first trigger, each of said one or more program cycles includes programming said first group of non-volatile storage elements and said second group of non-volatile storage elements together; and
means for verifying said first group of said non-volatile storage elements and said second group of said non-volatile storage elements together.

42. An apparatus according to claim 41, further comprising:
a first control line, said first group of said non-volatile storage elements are connected to said first control line, said second group of said non-volatile storage elements are connected to said first control line.

43. An apparatus according to claim 41, further comprising:
a word line, said first group of said non-volatile storage elements are connected to the word line, said second group of said non-volatile storage elements are connected to said word line, each non-volatile storage element of said first group of said non-volatile storage elements and said second group of said non-volatile storage elements are connected to different bit lines in an interleaving manner.

44. An apparatus according to claim 41, wherein said means for performing programming comprises:
means for applying a first program pulse to said first group of said non-volatile storage elements and said second group of non-volatile storage elements, inhibiting said second group of said non-volatile storage elements from programming in response to said first program pulse, and allowing said first group of said non-volatile storage elements to program in response to said first program pulse; and
means for applying a second program pulse to said first group of said non-volatile storage elements and said second group of said non-volatile storage elements, inhibiting said first group of said non-volatile storage elements from programming in response to said second program pulse, and allowing said second group of said non-volatile storage elements to program in response to said second program pulse.

45. An apparatus according to claim 44, further comprising:
word lines and bit lines, each non-volatile storage element of said first group of said non-volatile storage elements and said second group of said non-volatile storage elements are connected to different bit lines, said bit lines include even bit lines and odd bit lines, said first group of said non-volatile storage elements are connected to said even bit lines and said second group of said non-volatile storage elements are connected to said odd bit lines, said first group of said non-volatile storage elements is arranged in an interleaving manner with said second group of said non-volatile storage elements.

46. An apparatus according to claim 41, wherein said means for verifying said first group of non-volatile storage elements and said second group of non-volatile storage elements together includes:
means for applying one or more verify signals to a word line connected to said first group of said non-volatile storage elements and said second group of said non-volatile storage elements, and simultaneously sensing said first group of said non-volatile storage elements and said second group of said non-volatile storage elements.

47. An apparatus according to claim 41, wherein:
said first group of non-volatile storage elements and said second group of non-volatile storage elements do not have any non-volatile storage elements in common;
said verifying is performed at a third time that is subsequent to said second time;
said second time is subsequent to said first time; and
no verification of said first group of non-volatile storage elements and said second group of non-volatile storage elements is performed between said first time and said second time.

48. An apparatus according to claim 41, wherein:
said first group of non-volatile storage elements and said second group of non-volatile storage elements are flash memory devices.

49. An apparatus according to claim 41, wherein:
said first group of non-volatile storage elements and said second group of non-volatile storage elements are NAND flash memory devices.

* * * * *